United States Patent
Koya et al.

(10) Patent No.: US 6,428,619 B1
(45) Date of Patent: Aug. 6, 2002

(54) SILICON WAFER, AND HEAT TREATMENT METHOD OF THE SAME AND THE HEAT-TREATED SILICON WAFER

(75) Inventors: Hiroshi Koya; Hisashi Furuya; Yoji Suzuki; Yukio Muroi; Takaaki Shiota, all of Tokyo (JP)

(73) Assignee: Mitsubishi Materials Silicon Corporation, Tokyo (JP)

( * ) Notice: Subject to any disclaimer, the term of this patent is extended or adjusted under 35 U.S.C. 154(b) by 66 days.

(21) Appl. No.: 09/694,163

(22) Filed: Oct. 23, 2000

(51) Int. Cl.[7] .............................................. C30B 25/02
(52) U.S. Cl. .............................. 117/84; 117/90; 117/92; 428/212
(58) Field of Search ............................ 117/84, 90, 92; 428/212

(56) References Cited

U.S. PATENT DOCUMENTS 5,621,239 A * 4/1997 Horie et al. ................ 257/499
6,284,587 B1 * 9/2001 Yamauchi et al. .......... 438/240

* cited by examiner

*Primary Examiner*—Felisa Hiteshew
(74) *Attorney, Agent, or Firm*—Reed Smith LLP

(57) ABSTRACT

A method of heat-treating a silicon wafer has the steps of: preparing a silicon wafer having an oxygen concentration of $1.2 \times 10^{18}$ atoms/cm$^3$ or less (old ASTM) without generating crystal originated particles(COP'S) and interstitial-type large dislocation(L/D); forming a polysilicon layer of 0.1 μm to 1.6 μm in thickness on a back of the silicon wafer by a chemical-vapor deposition at a temperature of 670° C.±30° C.; and heat-treating the silicon wafer having the polysilicon layer in an oxygen atmosphere at 1000° C.±30° C. for 2 to 5 hours and subsequently at 1130° C.±30° C. for 1 to 16 hours. In this method, the silicon wafer before the formation of the polysilicon layer thereon is the type of a wafer in which oxidation induced stacking faults(OSF's) manifest itself at a center of the wafer when the wafer is subjected to the heat-treatment. Accordingly, the resulting silicon wafer with a polysilicon layer is of OSF fee and COP free, even when the wafer is subjected to the conventional OSF-manifesting heat treatment. The wafer with the polysilicon layer exerts a uniform gettering effect between the peripheral edge and center of the silicon wafer as a result of a uniform oxygen precipitation occurred at the entire surface of the silicon wafer.

11 Claims, 14 Drawing Sheets

Fe contamination

Cr contamination

Ni contamination

Cu contamination

Fe contamination

Cr contamination

Ni contamination (with haze)

Cu contamination

SILICON WAFER, AND HEAT TREATMENT METHOD OF THE SAME AND THE HEAT-TREATED SILICON WAFER

BACKGROUND OF THE INVENTION

1. Field of the Invention

The present invention relates to a method of heat treating a silicon wafer prepared by a Czochralski method (hereinafter, referred to as "a CZ method") to be used for manufacturing a semiconductor integrated circuit, a wafer to be used in such a method, and a heat-treated wafer obtained by such a heat treatment method.

2. Description of the Related Art

Recently, causes of deterioration of yields in processes for manufacturing semiconductor integrated circuits include existence of: micro defects of oxygen precipitations which lead to nuclei of oxidation induced stacking faults (hereinafter referred to as "OSF's"); crystal-originated particles (hereinafter referred to as "COP's"); and an interstitial-type large dislocation (hereinafter referred to as "L/D"). Micro defects as nuclei of OSF's are introduced into a silicon ingot during crystal growth, and actualize such as in an oxidation process on manufacturing semiconductor devices, leading to malfunctions such as increase of leakage current of fabricated devices. Meantime, cleaning mirror-polished silicon wafers by a mixed solution of ammonia and hydrogen peroxide leads to formation of pits on the wafer surface, and such pits are detected as particles similarly to real or intrinsic particles. Such pits are referred to as COP's, to distinguish them from real particles. COP's which are pits on a wafer surface cause deterioration of electric characteristics such as a time dependent dielectric breakdown (TDDB) characteristic and a time zero dielectric breakdown (TZDB) characteristic. Further, existence of COP's in a wafer surface causes physical steps during a wiring process of devices, and these steps cause wire breakage. In addition, it causes troubles such as leakage on a device separating portion, so that the yield of products is reduced.

On the other hand, an L/D is called a dislocation cluster, or a dislocation pit since a pit is formed when a silicon wafer having this defect is immersed in a selective etching solution containing hydrofluoric acid as a main ingredient. Such an L/D also causes deterioration of electric characteristics such as a leak characteristic and an isolation characteristic.

From the above, it is required to reduce OSF's, COP's and L/Ds from a silicon wafer to be used for manufacturing a semiconductor integrated circuit.

As a method for reducing such OSF's and L/Ds, there has been conventionally disclosed a defect-free silicon wafer free of OSF's, COP's and L/Ds in Japanese Patent Application Laid-Open Nos. HEI 8-330316 (1996) and HEI-11-1393 (1999).

In the method disclosed in Japanese Patent Application Laid-Open No. HEI 8-330316 (1996), a silicon monocrystal is grown at a lower speed so that OSF's being formed like a ring is disappeared from a center of the wafer and L/Ds are removed from the whole surface of the wafer, while OSF to be caused like a ring at the time of heat-treating the silicon monocrystal as a silicon wafer.

However, the range of speed for pulling a silicon monocrystal and the range of temperature gradation in the crystal in the axial direction for making a non-defective silicon monocrystal by the method disclosed in the above reference are confined in comparatively narrow limits, respectively. Manufacturing the non-defective silicon monocrystal will become more difficult with increasing diameter of a silicon monocrystal being pulled. In some cases, OSF's may be occurred as a mass on the central part of the wafer but not as a ring by the variations in the pulling speed or the like. The OSF's lead to deterioration of the leak characteristic as described above, so that the improvements on the process of manufacturing a silicon monocrystal have been demanded.

The method disclosed in Japanese Patent Application Laid-Open No. HEI-11-1393 (1999) including the step of pulling a single silicon crystal ingot comprising a perfect domain [P] from a silicon melt, where the perfect domain [P] is supposed to be free of agglomerates of vacancy point defects and free of agglomerates of interstitial silicon point defects within the ingot. The silicon wafer sliced out from the ingot consists of the perfect domain region [P]. The perfect domain [P] exists between an interstitial silicon point defect dominant domain [I] and a vacancy point defect dominant domain [V] within the single silicon crystal ingot. The silicon wafer comprising the perfect domain [P] is formed by determining a value of V/G (mm$^2$/minute °C.) such that OSF's generated in a ring shape during a thermal oxidization treatment disappears at the center of the wafer, in which V (mm/minute) is a pulling-up speed of the ingot, and G (°C./minute) is a vertical temperature gradient of the ingot near the interface between a silicon melt and the ingot.

On the other hand, some semiconductor device manufacturers may demand silicon wafers which are free of OSF's, COP's and L/Ds but have abilities for gettering metal contamination caused in the device process. Metal contamination of wafers having insufficient gettering abilities in the device process leads to junction leakage, and to occurrence of malfunctions of devices due to a trap level of metal impurities. To solve this problem, there has been demanded a silicon wafer that exerts the effect of intrinsic gettering (IG) by a heat treatment during the device process of the device maker.

The silicon wafer sliced out from the ingot comprising the perfect domain [P] described above is free of OSF's, COP's and L/Ds. However, oxygen precipitation is not necessarily caused within the wafer by the heat treatment in a device manufacturing process, leading to the disadvantage of causing an insufficient IG effect.

Conventionally, the step of treating a silicon wafer for making full use of the capabilities of. IG effect of the silicon wafer during the device process may be of making defections in the wafer in advance or adding impurities intentionally in advance. In the silicon wafer treated by such a step, contaminants generated by the subsequent steps are absorbed around the preformed defections of the wafer. Therefore, we can prevent the generation of any defection or contamination on an area in proximity to the wafer's surface on which a device is to be formed.

On the other hand, there is a tendency to decrease a heat treatment temperature to a temperature of 1,000° C. or less in the device process because of increasing the packing density of device in recent years. Therefore, it is strongly desirable to perform the IG treatment at a low temperature as a pretreatment in the device process.

Further, there has been proposed a heat treatment method for exhibiting an IG effect (Japanese Patent Application Laid-Open No. HEI-8-45945 (1996)), comprising the steps of: holding a silicon wafer just ground and polished after sliced out from a single silicon crystal ingot at 500 to 800° C. for 0.5 to 20 hours, to thereby introduce oxygen precipitation nuclei into the wafer; rapidly heating the silicon wafer including the oxygen precipitation nuclei from a room temperature to temperatures of 800–1,000° C. and holding the wafer for 0.5 to 20 minutes; leaving the silicon wafer rapidly heated and held for 0.5 to 20 minutes, down to a room temperature; and heating the thus cooled silicon wafer from temperatures of 500 to 700° C. up to temperatures of 800 to 1,100° C. at a rate of 2 to 10° C./minute, and holding the silicon wafer at this temperature for 2 to 48 hours.

In this treating method, at the surface as well as the interior of the wafer rapidly heated under the aforementioned temperature condition, the concentration of interstitial silicon atoms temporarily becomes lower than a thermal equilibrium concentration, leading to a depleted condition of interstitial silicon atoms to thereby provide an environment where oxygen precipitation nuclei tend to stably grow. Simultaneously, generation of interstitial silicon atoms are caused at the wafer surface so as to fill the depleted interstitial silicon atoms into a stable condition, so that the generated interstitial silicon atoms start to diffuse into the interior of the wafer. The area near the wafer surface which has been in the depleted condition of interstitial silicon atoms immediately falls into a saturated condition so that oxygen precipitation nuclei start to disappear. However, it will take some period of time for interstitial silicon atoms grown in the wafer surface to diffuse into the wafer interior. Thus, the deeper the distance from the wafer surface into the wafer interior, the longer the period of time over which an environment for easy growth of oxygen precipitation nuclei is maintained. Therefore, the closer to the wafer surface, the lower the density of oxygen precipitation nuclei. Further, the longer the heat treatment time (0.5 to 20 minutes), the greater the thickness of a denuded zone (hereinafter referred to as a "DZ") in which oxygen precipitation nuclei, i.e., defects are not formed. Moreover, the higher the temperature in the range of 800 to 1,000° C., the larger the diffusion coefficient of interstitial silicon atoms, so that the thickness of the DZ becomes large in a short time.

Rapidly heating, leaving at a room temperature and then heating again the wafer up to temperatures of 800 to 1,100° C. results in that those oxygen precipitation nuclei within the wafer, which have survived with the rapid heating, grow into oxygen precipitation and become stable IG sources. In the following description, the oxygen precipitation will be referred to as "bulk micro defect(BMD)".

However, the aforementioned heat treatment method requires, as a pre-treatment for generating IG sources, introducing oxygen precipitation nuclei into a silicon wafer just ground and polished by holding the wafer at 500 to 800° C. for 0.5 to 20 hours, and heat treating after rapid heating so as to render oxygen precipitation nuclei within the wafer to grow into BMD. This causes a problem of unnecessarily many times of heat treatment in the state of wafer.

SUMMARY OF THE INVENTION

The present invention is implemented to solve the foregoing problems. It is therefore a first object of the present invention is to provide a method of heat-treating a silicon wafer in the type of OSF free and COP free by avoiding the generation of OSF to be caused by the heat-treatment in spite of using a silicon wafer that is characterized in that OSF's manifests itself at the center of the wafer by the conventional OSF-manifesting heat treatment.

A second object of the present invention is to provide a silicon wafer with a polysilicon layer and a method of fabricating such a silicon wafer, where the silicon wafer exerts a uniform gettering effect between the peripheral edge and center of the silicon wafer as a result of a uniform oxygen precipitation occurred at the entire surface of the silicon wafer.

A third object of the present invention is to provide a method of heat-treating a silicon wafer, where a silicon wafer sliced from an ingot consisting of a mixed domain of $[P_V]$ and $[P_I]$ and having an oxygen concentration of $0.8 \times 10^{18}$ to $1.4 \times 10^{18}$ atoms/cm$^3$ (old ASTM) not only has no agglomerates of point defects, but also generates oxygen precipitation nuclei higher than a desired density by the heat treatment in the device manufacturing process to exert the IG effect.

A fourth object of the present invention is to provide a method of heat-treating a silicon wafer, where an oxygen donor killer treatment is not required.

A fifth object of the present invention is to provide a method of heat-treating a silicon wafer that exerts a high IG effect by subjecting the wafer to a heat treatment at a temperature of 950° C. or less and allows a reduction in the number of heat treatments on the silicon wafer.

A sixth object of the present invention is to provide a silicon wafer fabricated by the above novel method and exerting a high IG effect.

A seventh object of the present invention is to provide a silicon monocrystal ingot to produce the above silicon wafer capable of exerting a high IG effect.

In the first aspect of the present invention, a method of heat-treating a silicon wafer comprises the steps of: preparing a silicon wafer having an oxygen concentration of $1.2 \times 10^{18}$ atoms/cm$^3$ or less (old ASTM) without generating COP's and L/D; forming a polysilicon layer of 0.1 $\mu$m to 1.6 $\mu$m in thickness on a back of the silicon wafer by a chemical-vapor deposition at a temperature of 670° C.±30° C.; and heat-treating the silicon wafer having the polysilicon layer in an oxygen atmosphere at 1000° C.±30° C. for 2 to 5 hours and subsequently at 1130° C.±30° C. for 1 to 16 hours, wherein the silicon wafer before the formation of the polysilicon layer thereon is the type of a wafer in which OSF's manifest itself at a center of the wafer when the wafer is subjected to the heat-treatment.

In the second aspect of the present invention, a silicon wafer having a polysilicon layer comprises: a silicon wafer having an oxygen concentration of $1.2 \times 10^{18}$ atoms/cm$^3$ or less (old ASTM) without generating COP's and L/D, and a polysilicon layer of 0.1 to 1.6 $\mu$m in thickness formed on a back of the wafer, wherein the silicon wafer before the formation of the polysilicon layer thereon is the type of a wafer in which OSF's manifest itself at a center of the wafer when the wafer is heat-treated in an oxygen atmosphere at 1000° C.±30° C. for 2 to 5 hours and subsequently at 1130° C.±30° C. for 1 to 16 hours.

The silicon wafers according to the first and second aspects are the type of a wafer prepared by the CZ method so as to appear OSF's at the center of the wafer, and having comparatively many precipitation nuclei of oxygen at the center but hardly having precipitation nuclei of oxygen at the rest which is COP free. When forming a polysilicon layer on a back of the silicon wafer by the CVD method, BMD is formed at the entire surface of the wafer during the process of CVD. As a result of a uniform oxygen precipitation occurred at the entire surface of the wafer, the wafer obtains a uniform IG between the center and the rest thereof.

In the third aspect of the present invention, a method of heat-treating a silicon wafer sliced out from an ingot consisting of a perfect domain [P], comprises the steps of: pulling up a silicon monocrystal ingot consisting of a mixed domain of $[P_V]$ and $[P_I]$ and having an oxygen concentration of $0.8 \times 10^{18}$ to $1.4 \times 10^{18}$ atoms/cm$^3$ (old ASTM) from a silicon melt; slicing the ingot into silicon wafers; and holding the sliced silicon wafer in a gaseous atmosphere selected from the group consisting of nitrogen, argon, hydrogen, oxygen, and mixtures thereof at a temperature of 600 to 850° C. for 30 to 90 minutes, where $[P_I]$ is a domain neighboring with a domain $[I]$, is classified into the perfect domain $[P]$, and has a concentration of interstitial silicons lower than the lowest concentration of interstitial silicons capable of forming interstitial dislocations, and where $[P_V]$ is a domain neighboring with a domain $[V]$, is classified into the perfect domain $[P]$, and has a concentration of vacancies equal to or lower than a concentration of vacancies capable of forming COP's or FPD's, where the domain $[I]$ is a domain dominated by interstitial silicon point defects and including agglomerates of interstitial silicon point defects within an ingot, the domain $[V]$ is a domain dominated by vacancy point defects and including agglomerates of vacancy point defects within the ingot, and the perfect domain $[P]$ is a domain including no agglomerates of vacancy point defects and no agglomerates of interstitial silicon point defects.

In the fourth aspect of the present invention, a method of heat-treating a silicon wafer sliced out from an ingot consisting of the above perfect domain $[P]$, comprises the steps of: pulling up a silicon monocrystal ingot consisting of the above mixed domain of $[P_V]$ and $[P_I]$ and having an oxygen concentration of $0.8 \times 10^{18}$ to $1.4 \times 10^{18}$ atoms/cm$^3$ (old ASTM) from a silicon melt; slicing the ingot into silicon wafers; and holding the sliced silicon wafer in a gaseous atmosphere selected from the group consisting of nitrogen, argon, hydrogen, oxygen, and mixtures thereof at a temperature of 600 to 850° C. for 120 to 250 minutes.

In the fifth aspect of the present invention, a method of heat-treating a silicon wafer sliced out from an ingot consisting of the above perfect domain $[P]$, comprises the steps of: pulling up a silicon monocrystal ingot consisting of the above mixed domain of $[P_V]$ and $[P_I]$ and having an oxygen concentration of $0.8 \times 10^{18}$ to $1.4 \times 10^{18}$ atoms/cm$^3$ (old ASTM) from a silicon melt; slicing the ingot into silicon wafers; heating the sliced silicon wafer in a gaseous atmosphere selected from the group consisting of nitrogen, argon, hydrogen, oxygen, and mixtures thereof at rising temperatures from room temperature to a predetermined temperature of 1150° C. to 1200° C. at a rate of 10 to 150° C./second; and holding the heated silicon wafer at the predetermined temperature of 1150° C. to 1200° C. for 0 to 30 seconds.

In the third to fifth aspects of the present invention, the ingot has an oxygen concentration of $0.8 \times 10^{18}$ to $1.4 \times 10^{18}$ atoms/cm$^3$ (old ASTM) and consists of the mixed domain of $[P_V]$ and $[P_I]$. When a silicon wafer sliced out from the above ingot is heat-treated in the above condition, not only a density of precipitation nuclei of oxygen enhances at the domain $[P_V]$ in which precipitation nuclei of oxygen introduce during crystal growth but also precipitation nuclei of oxygen emerge at the domain $[P_I]$ in which precipitation nuclei of oxygen do not introduce during crystal growth. Accordingly, when the above heat-treated wafer is subjected to the heat treatment in the device manufacturing process of a semiconductor device maker, the above precipitation nuclei of oxygen grow up to BMD to thereby exert the IG effect at the entire surface of the wafer even if the wafer consists of the mixed domain of $[P_V]$ and $[P_I]$.

In the sixth aspect of the present invention, a method of heat-treating a silicon wafer comprises the steps of: pulling up a silicon monocrystal ingot from a silicon melt; forming a silicon wafer from the ingot; and rapidly heating the silicon wafer from a room temperature to a predetermined temperature of 650 to 950° C. at a rate of 10° C./minute or over and holding the silicon wafer for 0.5 to 30 minutes, wherein the silicon wafer generates OSF's in an area wider than 25% of the entire area thereof and an oxygen precipitation of $1 \times 10^5$ to $3 \times 10^7$/cm$^3$ without an occurrence of dislocation when the wafer is subjected to the heat-treatment.

The method in the sixth aspect of the present invention exerts a high IG effect by rapidly heating the polished wafer which is obtained the ingot under the above condition without conventional processes of pre-annealing to introduce precipitation nuclei of oxygen into the wafer and growing up precipitation nuclei of oxygen to BMD's.

The above and other objects, effects, features and advantages of the present invention will become more apparent from the following description of embodiments thereof taken in conjunction with the accompanying drawings.

DETAILED DESCRIPTION OF THE EMBODIMENTS

[A] First Embodiment of the Present Invention

Figure 1:
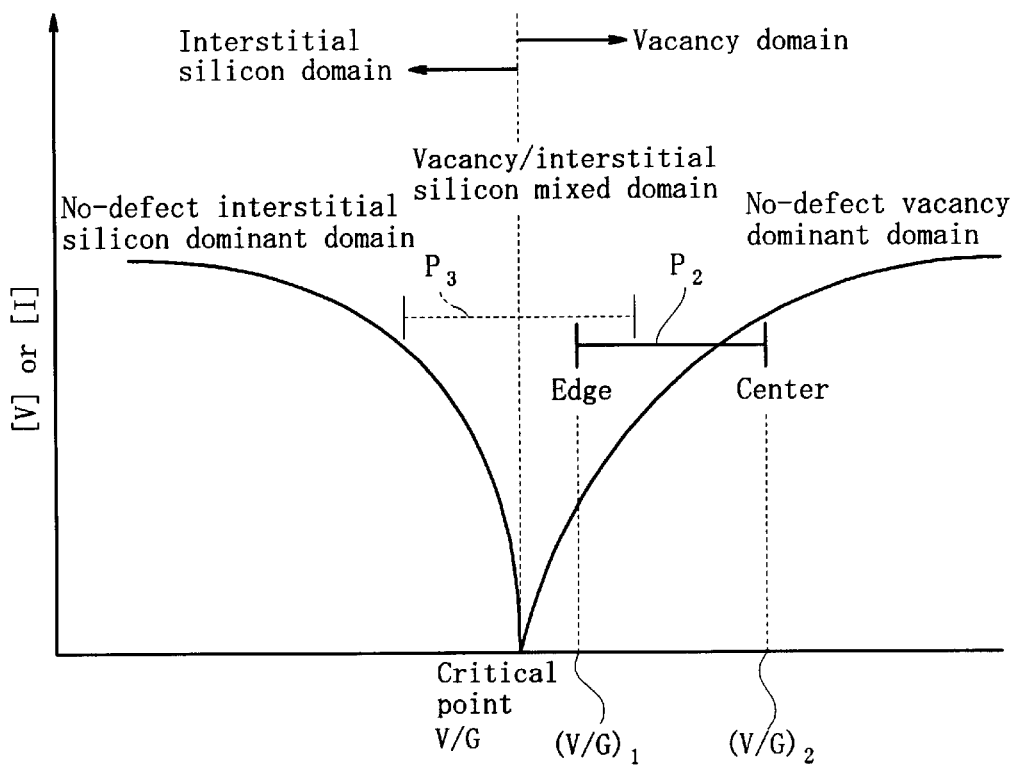
FIG. 1 is a view showing a relationship between a V/G ratio and a vacancy point defect density or an interstitial silicon point defect density in a first embodiment of the present invention, based on a Voronkov theory.
Figure 2:
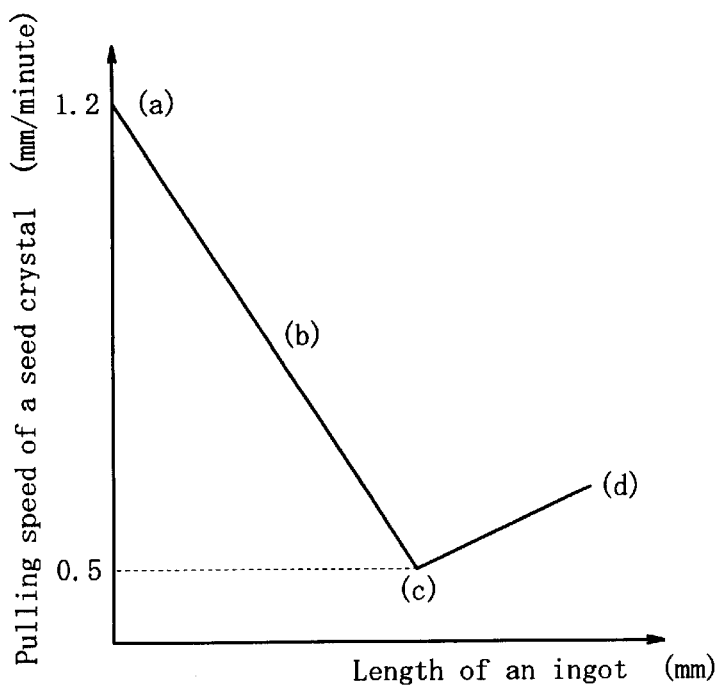
FIG. 2 is a characteristic diagram showing a transition of a pulling-up speed for determining a desired pulling-up speed profile.

As shown in FIGS. 1 and 2 of silicon wafers according to first through fourth embodiments of the present invention is fabricated by pulling up an ingot from a silicon melt within a hot zone furnace by a CZ method at a predetermined pulling-up speed profile based on a Voronkov theory, and by slicing the ingot.

Generally, when an ingot of single crystal of silicon is pulled up from a silicon melt within a hot zone furnace by a CZ method, there are caused point defects and agglomerates (three-dimensional defects) as defects in the single crystal of silicon. Point defects are classified into two general types, i.e., a vacancy point defect and an interstitial point defect. The vacancy point defect is a type where one silicon atom is omitted from a normal position within a silicon crystal lattice. Such a vacancy leads to a vacancy point defect. Meanwhile, the presence of a silicon atom at a non-lattice point (interstitial site) leads to an interstitial silicon point defect.

Further, point defects are generally formed at an interface between a silicon melt (melted silicon) and an ingot (solid silicon). However, as the ingot is pulled up, the portion having been the interface starts to be cooled. During the cooling, vacancy point defects or interstitial point defects diffuse to be mutually merged to thereby form vacancy agglomerates or interstitial agglomerates, respectively. In other words, agglomerates are three-dimensional structures generated by the combination of point defects.

Agglomerates of vacancy point defects include defects called "LSTD (Laser Scattering Tomograph Defects)" or "FPD (Flow Pattern Defects)" in addition to the aforementioned COP's, while agglomerates of interstitial silicon point defects include defects called "L/D" as noted above. Further, FPD's are sources of traces which exhibit a unique flow pattern which appears when a silicon wafer fabricated by slicing an ingot is subjected to a Secco etching (i.e., etching by a mixed solution of $K_2Cr_2O_7$:50% HF:pure water=44 g:2,000 cc:1,000 cc) for 30 minutes without agitation. LSTD are sources which have refractive indexes different from that of silicon and which generate scattered light upon radiation of infrared rays into a single crystal of silicon.

The aforementioned Voronkov theory is to control a V/G ratio ($mm^2$/minute °C.) so as to grow a high purity ingot having fewer defects, where V (mm/minute) is a pulling-up speed of an ingot and G (°C./mm) is a temperature gradient at an interface between an ingot and silicon melt in a hot zone structure. According to this theory, the relationship between V/G and point defect density is diagramatically represented as shown in FIG. 1 in which the abscissa represents V/G and the ordinate represents a vacancy point defect density and an interstitial silicon point defect density, to thereby demonstrate that the boundary between a vacancy domain and an interstitial silicon domain is determined by the V/G ratio. More specifically, an ingot dominated by a vacancy point defect density is formed when the V/G ratio is greater than a critical point, while an ingot dominated by an interstitial silicon point defect density is formed when the V/G ratio is smaller than the critical point.

The predetermined pulling-up speed profile for the first embodiment of the present invention is determined such that the ratio (V/G) of a pulling-up speed to a temperature gradient largely exceeds a first critical ratio $((V/G)_1)$ for avoiding occurrence of agglomerates of interstitial silicon point defects, and lessens a second critical ratio $((V/G)_2)$ for restricting vacancy agglomerates to a vacancy point defect dominant domain at the center of an ingot, when the ingot is pulled up from a silicon melt within a hot zone furnace.

This pulling-up speed profile is determined by a simulation based on the Voronkov theory, such as by empirically slicing a reference ingot in an axial direction, by empirically slicing a reference ingot into wafers, or by combining these techniques. Namely, this determination is performed by confirming the axial slice of the ingot and sliced wafers after the simulation, and then repeating the simulation. There are determined a plurality of kinds of pulling-up speeds in a predetermined range, and a plurality of reference ingots are grown. The pulling-up speed profile for the simulation is adjusted from a higher pulling-up speed such as 1.2 mm/min as shown in FIG. 2(a), via a lower pulling-up speed as 0.5 mm/min as shown in FIG. 2(c), to a pulling-up speed as shown in FIG. 2(d). The aforementioned lower pulling-up speed may be 0.4 mm/min or less, and the pulling-up speeds (b) and (d) are preferably made to be linear.

Multiple reference ingots pulled up at different speeds are sliced in axial directions, respectively. There is determined an optimum V/G ratio based on a correlation between the axial slices, confirmation of wafers, and the result of the simulation, then an optimum pulling-up speed profile is determined, and ingots are manufactured based on such a profile. The actual pulling-up speed profile depends on various parameters such as a diameter of a desired ingot, a specific hot zone furnace to be used, and a quality of a silicon melt, without limited thereto.

Figure 3:
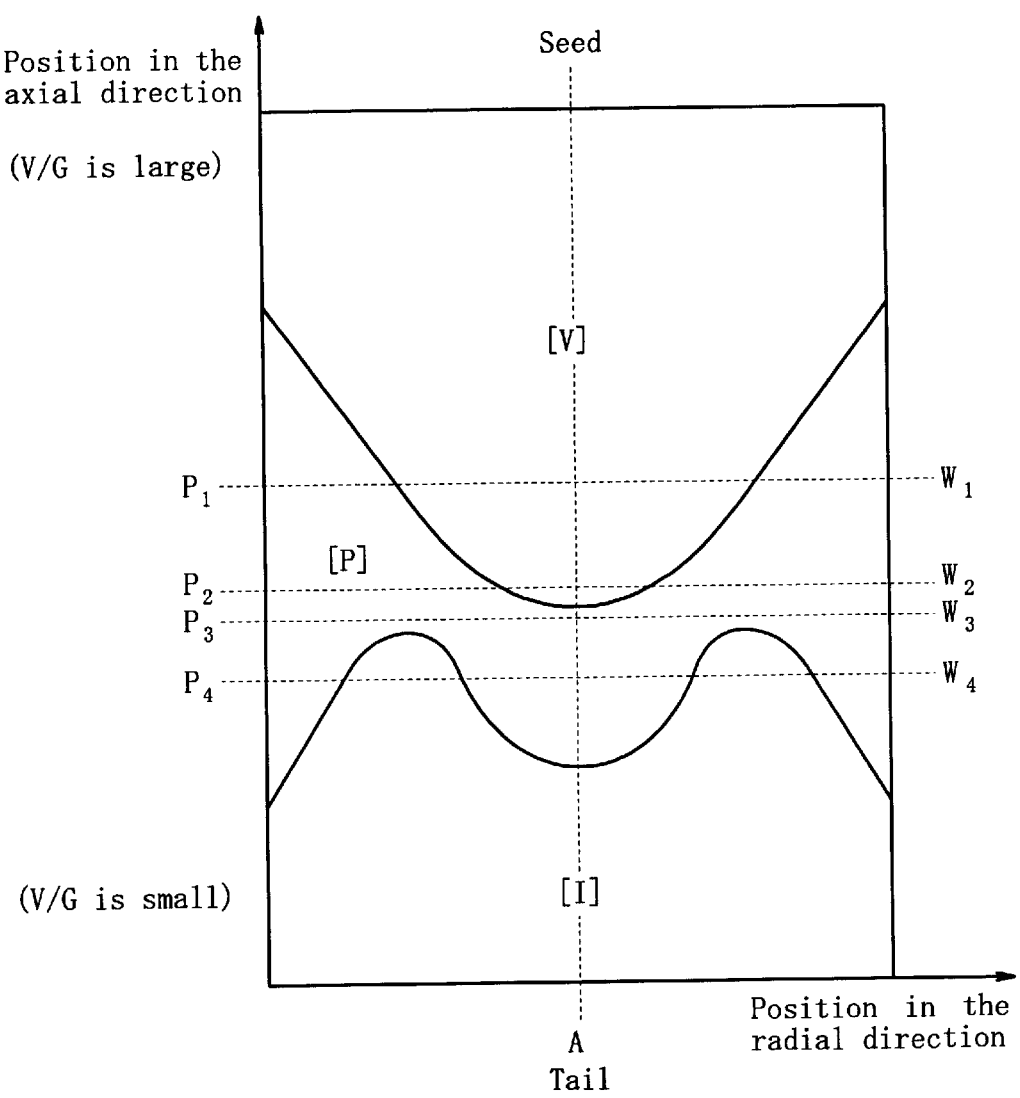
FIG. 3 is a schematic view of an X-ray tomographic image showing a vacancy point defect dominant domain, an interstitial silicon point defect dominant domain, and a perfect domain of a reference ingot according to the first embodiment of the present invention.

FIG. 3 actually shows a cross-sectional view of an ingot obtained by gradually decreasing the pulling-up speed to thereby continuously lower the V/G ratio. In FIG. 3, the mark [V] represents a domain dominated by vacancy point defects and including agglomerates of vacancy point defects within an ingot, the mark [I] represents a domain dominated by interstitial silicon point defects and including agglomerates of interstitial silicon point defects, and the mark [P] represents a perfect domain including no agglomerates of vacancy point defects and no agglomerates of interstitial silicon point defects.

Note, agglomerates of COP's and L/Ds may present different values of detection sensitivities and detection lower limits, depending on detection methods. As such, the phrase "agglomerates of point defects do not exist" herein means that the number of agglomerates of point defects is less than a detection lower limit ($1 \times 10^3$ pieces/cm$^3$) which is determined where one piece of defect agglomerate of a flow pattern (vacancy defect) and dislocation cluster (interstitial silicon point defect) is detected for a testing volume of $1 \times 10^{-3}$ cm$^3$ upon observing, as the testing volume, a product of an observing area and an etching allowance by an optical microscope after Secco etching a mirror-machined single crystal of silicon without agitation.

As shown in FIG. 3, the axial position $P_1$ of the ingot is a domain entirely dominated by vacancy point defects. The position $P_2$ includes a center domain dominated by vacancy point defects, compared with that of the position $P_1$. The position $P_4$ includes a ring dominated by interstitial silicon point defects, and a center perfect domain. The position $P_3$ does not include vacancy point defects in the center and also interstitial silicon defects in the edge portion, so that it is an entirely perfect domain.

As apparent from FIG. 3, the wafer $W_1$ corresponding to the position $P_1$ is a domain entirely dominated by vacancy point defects. The wafer $W_2$ corresponding to the position $P_2$ includes a center domain dominated by vacancy point defects, compared with that of the wafer $W_1$. The wafer $W_4$ corresponding to the position $P_4$ includes a ring dominated by interstitial silicon point defects, and a center perfect domain. The wafer $W_3$ corresponding to the position $P_3$ does not include vacancy point defects in the center and also interstitial silicon defects in the edge portion, so that it is an entirely perfect domain.

Figure 4:
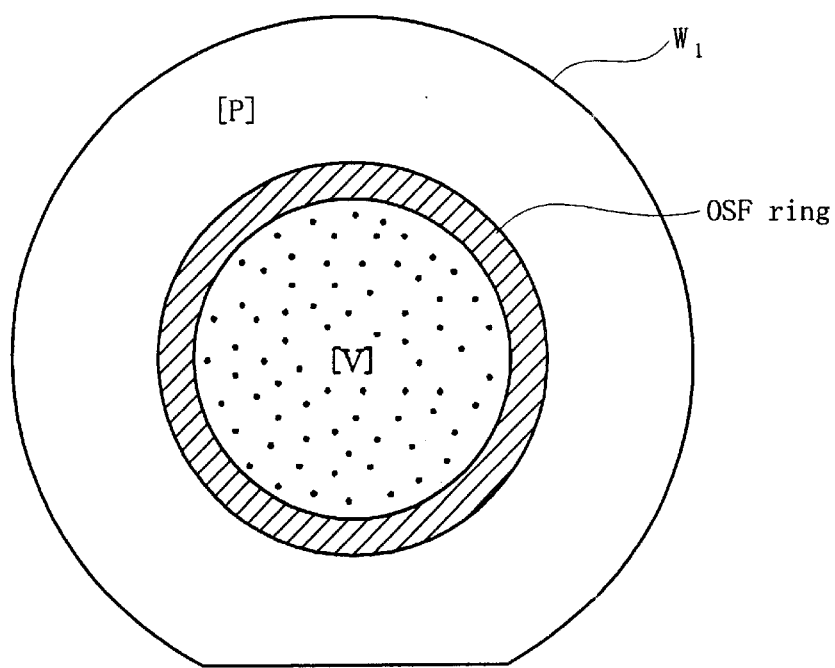
FIG. 4 is a view showing a situation where OSF's appear in a silicon wafer $W_1$ corresponding to a position $P_1$ in FIG. 3.
Figure 5:
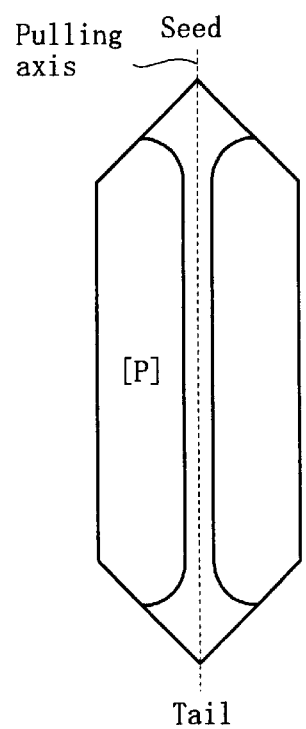
FIG. 5 is a cross sectional view showing an ingot sliced along in the axial direction through an axial center of the ingot, correspondingly to a position $P_2$ in FIG. 3.
Figure 6:
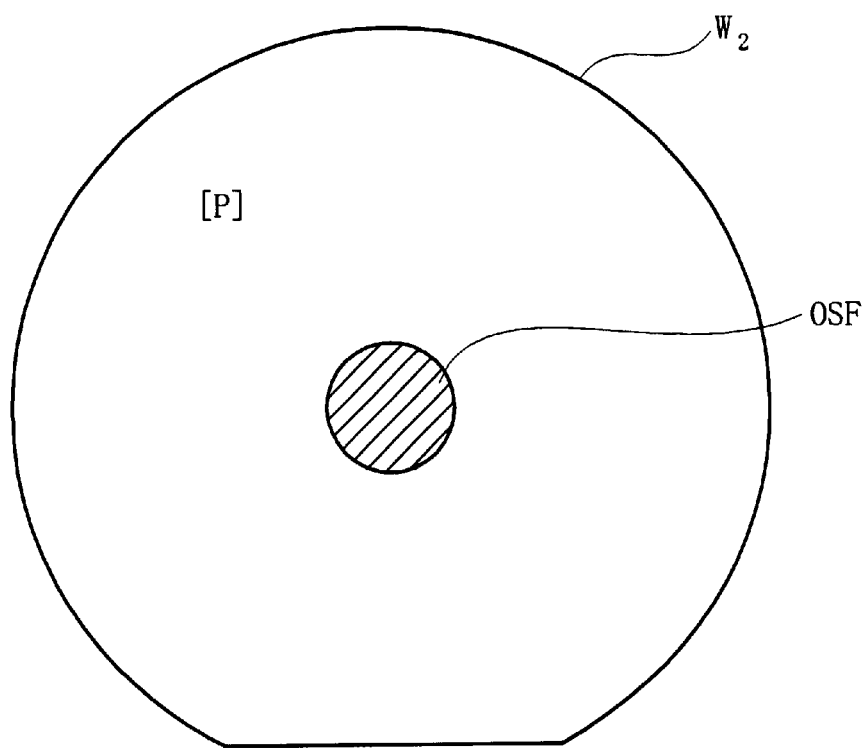
FIG. 6 is a plan view showing a situation where OSF's appear at the center of a silicon wafer $W_2$ according to the first embodiment of the present invention, corresponding to the position $P_2$ in FIG. 3.

In a minimal domain adjacent to the perfect domain in which such vacancy point defects are dominantly existed is a domain that does not generate any COP or L/D in the wafer surface. However, OSF's can be generated by the process depending on the conventional OSF manifesting heat treatment, when the silicon wafer is heat treated at temperatures in a range of 1,000° C.±30° C. for 2 to 5 hours and subsequently heat treated at temperatures in a range of 1,130° C.±30° C. for 1 to 16 hours. That is, an OSF ring is generated near half the radius of the wafer $W_1$ as shown in FIG. 4. The domain surrounded by the OSF's, in which the vacancy point defects are dominantly existed, tends to generate COP. In the wafer $W_2$, on the other hand, the OSF's are not shaped like a ring. The OSF's are only generated at the center of the wafer $W_2$. The silicon wafer $W_2$ to be used in the first embodiment is such a wafer $W_2$. In the silicon wafer $W_2$ of the first embodiment, the OSF's are not shaped like a ring as shown in FIG. 5. It is formed by slicing a silicon ingot grown with the predetermined pulling-up speed profile so that the OSF's are only generated at the center of the wafer $W_2$ as shown in a plan view of FIG. 6. In the silicon wafer $W_2$, the OSF is not shaped like a ring, so that the number of COP's in the entire wafer surface of which is zero (COP free) and also there is no occurrence of interstitial dislocation.

In the silicon wafer of the first embodiment, the oxygen concentration within the wafer is further controlled. In the CZ method, the oxygen concentration within a wafer can be controlled such as by changing a flow rate of argon to be supplied into a hot zone furnace, a rotational speed of a quartz crucible for storing a silicon melt, and a pressure within the hot zone furnace. The oxygen concentration within the wafer is adjusted to $1.2 \times 10^{18}$ atoms/cm$^3$ or less. For attaining such an oxygen concentration, for example, the flow rate of argon is controlled to be 80 to 150 liter/minute, the rotational speed of a quartz crucible for storing a silicon melt is controlled to be 4 to 9 rpm, and the pressure within a hot zone furnace is controlled to be 15 to 60 Torr. The reason for adjusting the oxygen concentration to $1.2 \times 10^{18}$ atoms/cm$^3$ or less (old ASTM) is to prevent an excess of oxygen precipitation nuclei.

A polysilicon layer of 0.1 to 1.6 μm in thickness is formed on the surface of a silicon wafer fabricated by slicing the ingot pulled up under the above condition by the CVD method using SiH$_4$ or the like at temperatures of 670° C.±30° C. If the thickness of the polysilicon layer is less than 0.1 μm, it produces little effect. If it is larger than 1.6 μm, it decrees productivity. Therefore, it is preferable that the thickness of the polysilicon layer is in the range of 1.0 to 1.6 μm. In spite of uniform distribution of oxygen concentration in the wafer surface before the step of forming a polysilicon layer, the oxygen precipitation may be easily occurred at the center of the wafer while it is hardly occurred on the other portions thereof. The polysilicon layer allows the uniform distribution of the oxygen precipitation in the wafer surface.

Accordingly, after the silicon wafer where the oxygen precipitation nuclei exist is provided with the polysilicon layer, if the silicon wafer with the polysilicon layer is subjected to heat treatment in the semiconductor device process, the growth of the nuclei is stopped. Thus, there is no OSF generation in spite of performing the conventional OSF-manifesting heat treatment.

[B] Second Embodiment of the Present Invention

Figure 7:
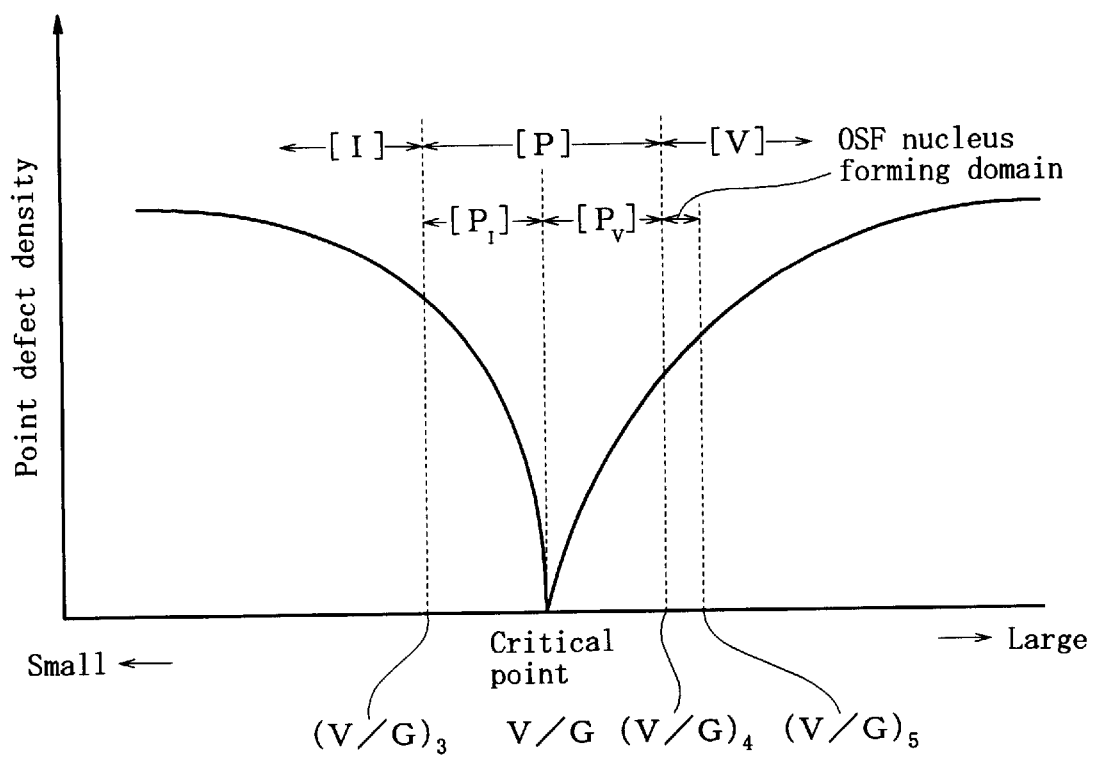
FIG. 7 is a view showing a relationship between a V/G ratio and a vacancy point defect density or an interstitial silicon point defect density in second and third embodiments of the present invention, based on the Voronkov theory.

In the second embodiment of the present invention, a silicon ingot is pulled up from a silicon melt based on the Voronkov theory, similarly to the first embodiment. As shown in FIG. 7, the predetermined pulling-up speed profile for the second embodiment of the present invention is determined such that the ratio (V/G) of a pulling-up speed to a temperature gradient is held at a predetermined value. In this case, the value is defined so as to be equal to or greater than a third critical ratio (($V/G)_3$) for avoiding occurrence of agglomerates of interstitial silicon point defects, and also it is defined to be equal to or less than a fourth critical ratio ((V/G)$_4$) for restricting agglomerates of vacancy point defects within a center domain dominated by vacancy point defects, when the ingot is pulled up from a silicon melt within a hot zone furnace. In FIG. 7, the mark [I] represents a domain a third critical ratio (V/G)$_3$ or less dominated by interstitial silicon point defects and including interstitial silicon point defects, the mark [V] represents a domain (a fourth critical ratio (V/G)$_4$ or greater) dominated by vacancy point defects and including agglomerates of vacancy point defects within an ingot, and the mark [P] represents a perfect domain ((V/G)$_3$ to (V/G)$_4$) including no agglomerates of vacancy point defects and agglomerates of interstitial silicon point defects. The domain [V] neighboring with the domain [P] includes a domain [OSF] ((V/G)$_4$ to (V/G)$_5$) for forming OSF nuclei.

The perfect domain [P] is further classified into a domain [P$_I$] and a domain [P$_V$]. The domain [P$_I$] has the V/G ratio from the (V/G)$_3$ to the critical point, and the domain [P$_V$] has the V/G ratio from the critical point to the (V/G)$_4$. Namely, the domain [P$_I$] neighbors with the domain [I] and has an interstitial silicon point defect density lower than the lowest interstitial silicon point defect density capable of forming interstitial dislocations, and the domain [P$_V$] neighbors with the domain [V] and has a vacancy point defect density lower than the lowest vacancy point defect density capable of forming OSF's.

Figure 8:
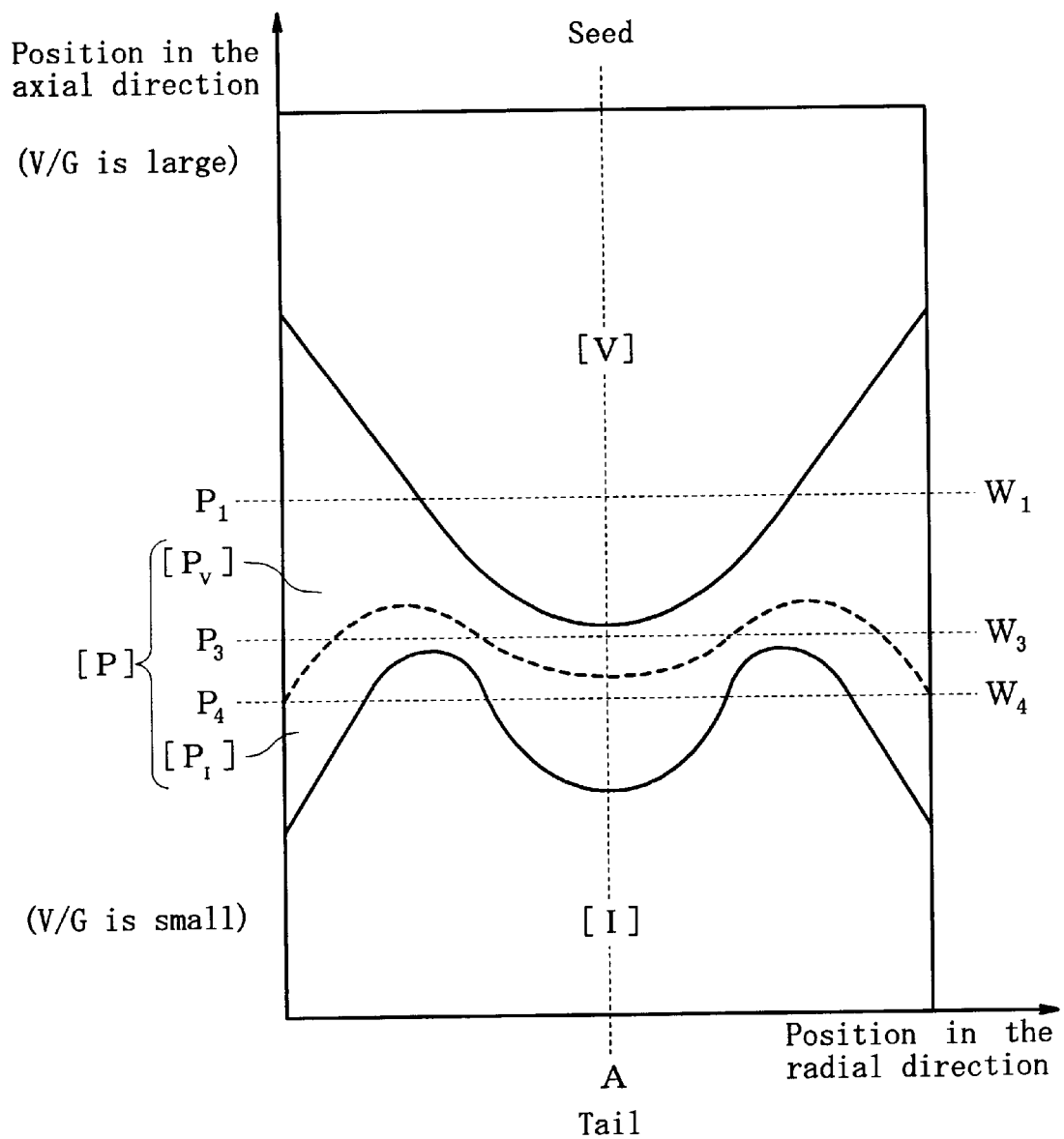
FIG. 8 is a schematic view of an X-ray tomographic image showing a vacancy point defect dominant domain, an interstitial silicon point defect dominant domain, and a perfect domain of a reference ingot according to the second and third embodiments of the present invention.

The facts shown in FIG. 8 can be recognized by drawing a cross-sectional view of an ingot prepared by the process in which the pulling-up speed is gradually lowered to thereby continuously lower the ratio (V/G). In FIG. 8, the mark [V] represents a domain dominated by vacancy point defects within an ingot, the mark [I] represents a domain dominated by interstitial silicon point defects, and the mark [P] represents a perfect domain including no agglomerates of vacancy point defects and no agglomerates of interstitial silicon point defects. As described above, the perfect domain [P] is further classified into a domain [P$_I$] and a domain [P$_V$]. The domain [P$_V$] includes vacancy point defects not progressed into agglomerates within the perfect domain [P], and the domain [P$_I$] includes interstitial silicon point defects not progressed into agglomerates within the perfect domain [P].

As shown in FIG. 8, the position P$_1$ in the axial direction of the ingot includes a center domain dominated by vacancy point defects. The position P$_4$ includes a ring dominated by interstitial silicon point defects and a center perfect domain. The position P$_3$ is an entirely perfect domain without including agglomerates of the vacancy point defects in the center and also without including agglomerates of the interstitial silicon point defects on the edge to be associated with the second embodiment.

As is evident from FIG. 8, the wafer W$_1$ corresponding to the position P$_1$ includes a center domain dominated by vacancy point defects. The wafer W$_4$ corresponding to the position P$_4$ includes a ring dominated by interstitial silicon point defects and a center perfect domain. The wafer W$_3$ corresponding to the position P$_3$ is an entirely perfect domain, where the domains [P$_V$] and [P$_I$] coexist together. A small domain ((V/G)$_4$ to (V/G)$_5$ in FIG. 7) adjacent to the perfect domain dominated by vacancy point defects is of without generating COP and L/D in the wafer surface. However, OSF's are generated if the wafer W$_1$ is subjected to the conventional OSF-manifesting heat treatment, where the wafer W$_1$ is heat treated at temperatures in a range of 1,000° C.±30° C. for 2 to 5 hours and subsequently heat treated at temperatures in a range of 1,130° C.±30° C. for 1 to 16 hours. As shown in FIG. 4 and described in the first embodiment, an OSF ring is generated near half the radius of the wafer W$_1$. There is a tendency to generate COP in the domain dominated by vacancy point defects surrounded by such an OSF ring.

Figure 9:
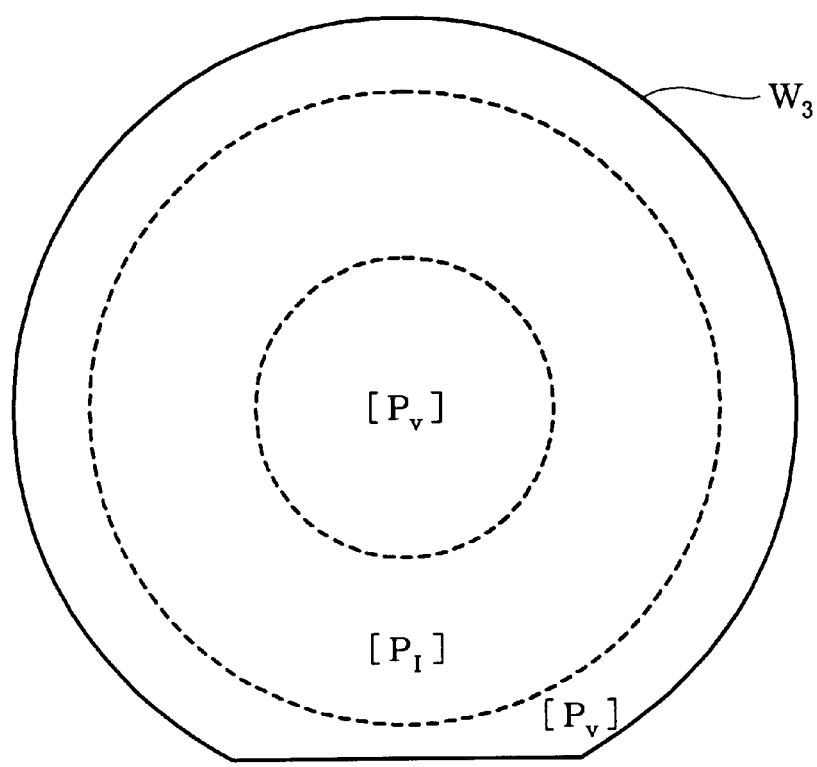
FIG. 9 is a plan view showing a situation where OSF's appear in a silicon wafer $W_3$ corresponding to a position $P_3$ in FIG. 8.

The wafer according to the second embodiment is the wafer W$_3$ and the plan view thereof is shown in FIG. 9. The wafer W$_3$ is required to have its oxygen concentration of 0.8×10$^{18}$ to 1.4×10$^{18}$ atoms/cm$^3$ (old ASTM) so as to generate oxygen precipitation nuclei higher than a desired density by the heat treatment of the second embodiment.

Then, we will describe the heat treatment on the above silicon wafer W$_3$ in the following description. The heat treatment on the above silicon wafer W$_3$ comprises the steps of: holding the silicon wafer in an atmosphere of nitrogen, argon, hydrogen or oxygen or mixture thereof at temperatures of 600° C. to 850° C. for 30 to 90 minutes or at temperatures of 600° C. to 850° C. for 120 to 250 minutes. Heating is preferably conducted by introducing the wafer at a rate of 50 to 100° C./minute into a heat treatment furnace held at 600 to 850° C. Holding temperatures lower than 600° C. or holding times shorter than 30 minutes lead to insufficient increase of oxygen precipitation nuclei, resulting in failure of a BMD density required to exhibit an IG effect upon conducting the heat treatment in the process of fabricating a device by the semiconductor device manufacturer. Holding temperatures exceeding 850° C. results in failure of a BMD density required to exhibit an IG effect upon conducting the next second step heat treatment, due to the lower density of oxygen precipitation nuclei of the domain [P$_I$]. Holding temperatures between 600° C. to 850° C. and holding time exceeding 90 minutes and shorter than 120 minutes leads to restriction of a precipitation amount of oxygen precipitation nuclei, due to excess of interstitial point defects accompanying to formation of oxygen precipitation nuclei. Holding time of 250 minutes or longer leads to reduced productivity.

The above conditions of the heat treatment are included in the conditions of the heat treatment for forming a polysilicon layer on the back of the wafer (i.e., holding temperatures between 650° C.±30° C. and holding times 5 to 300 minutes). Thus, the object of the second embodiment of the present invention can be attained by the formation of polysilicon layer in accordance with the second embodiment of the present invention. In this case, the thickness of the polysilicon layer is in the rage of 0.1 to 2.0 μm. The amount of oxygen precipitation nuclei in the neighborhood of the back of the wafer in contact with the polysilicon layer is further increased. In this wafer configuration, by the way, the polysilicon layer may be left as it is or may be removed using an alkali etching liquid prepared by diluting KOH or NaOH with water or an acid etching liquid prepared by diluting a mixture of fluorine acid and nitric acid with water or acetic acid.

The above heat treatment eliminates the need for an oxygen donor killer treatment provided as one of the steps of the wafer process.

[C] Third Embodiment of the Present Invention

In the third embodiment of the present invention, a silicon ingot is pulled up from a silicon melt based on the Voronkov theory, similarly to the first embodiment. The predetermined pulling-up speed profile of the third embodiment is the same one as that of the second embodiment.

The silicon wafer according to the third embodiment is the wafer W$_3$ shown in FIG. 8 and FIG. 9. The wafer W$_3$ is required to have its oxygen concentration of 0.8×10$^{18}$ to 1.4×10$^{18}$ atoms/cm$^3$ (old ASTM) so as to generate oxygen precipitation nuclei higher than a desired density by the heat treatment of the third embodiment.

The heat treatment of the third embodiment is rapid heating and is conducted by heating the wafer $W_3$ in an atmosphere of nitrogen, argon, hydrogen or oxygen or mixture thereof from a room temperature up to temperatures of 1,150° C. to 1,200° C. at a temperature elevating speed of 10° C./second to 150° C./second, and hold the wafer $W_3$ at temperatures of 1,150° C. to 1,200° C. for 0 to 30 seconds. Tht is, the heat treatment performed in the third embodiment is the type a rapid heating. Herein, a holding time of 0 second means that only temperature elevation is conducted, and holding is not conducted. Heating is conducted by introducing the wafer into a heat treatment furnace held at a room temperature or into the interior of a heat treatment furnace held at a temperature of several hundreds degrees by residual heat in case of a continuous operation, and temperature elevated to temperatures of 1,150° C. to 1,200° C. at a rate of 10° C./second to 150° C./second, preferably 50° C./second to 100° C./second. Temperature elevating speeds slower than 10° C./second leads to increase of oxygen precipitation nuclei but results in a deteriorated and thus impractical processing ability. Holding temperatures lower than 1,150° C. leads to insufficient increase of oxygen precipitation nuclei, resulting in failure of a BMD density required to exhibit an IG effect upon conducting the next second step heat treatment. Holding temperatures exceeding 1,200° C. or holding time exceeding 30 seconds results in a problem such as occurrence of slippage and deteriorated productivity of heat treatment and reduction. Temperature elevating speeds exceeding 150° C./second result in a problem of occurrence of slippage due to dispersion of tare stress and in-plane temperature distribution.

The above heat treatment eliminates the need for an oxygen donor killer treatment provided as one of the steps of the wafer process.

[D] Fourth Embodiment of the Present Invention

Figure 10:
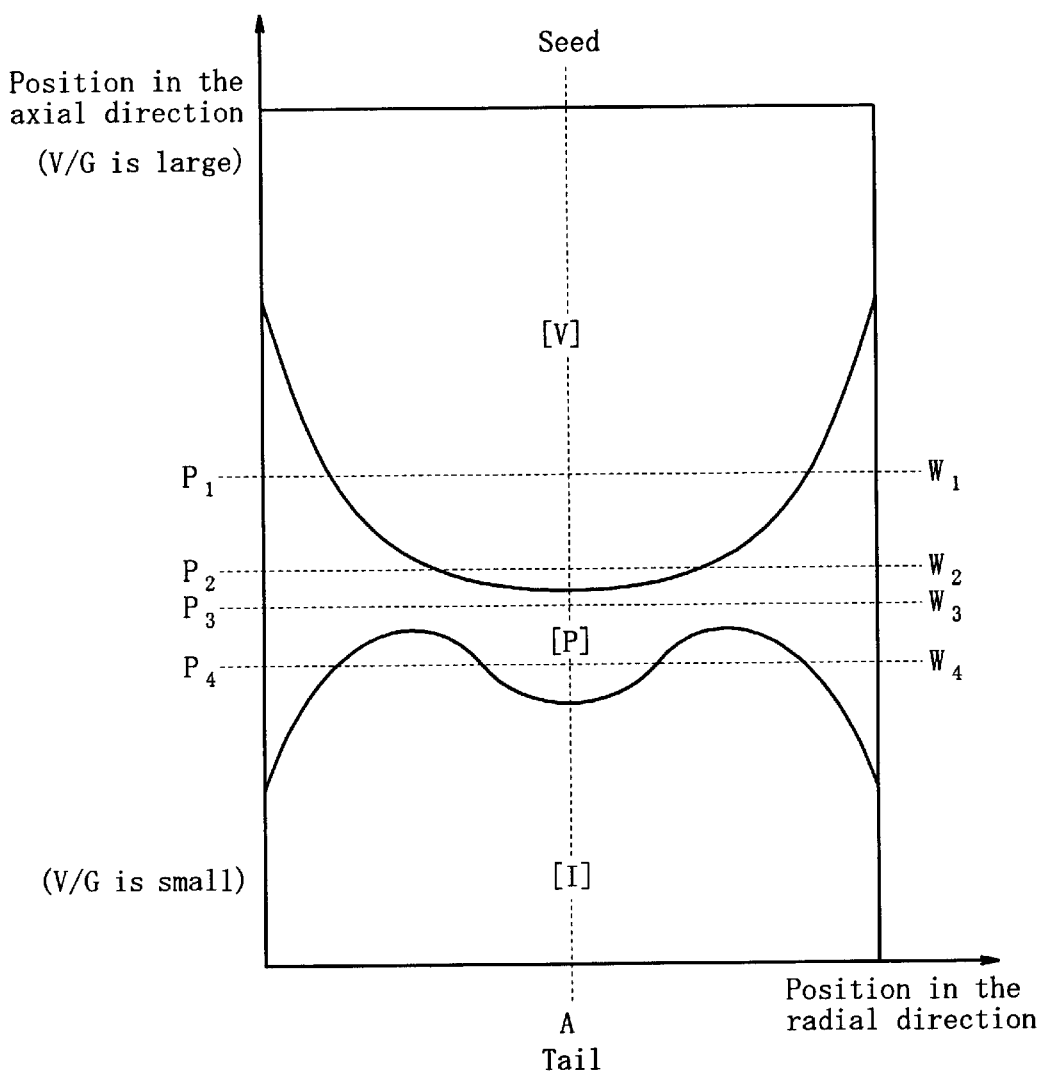
FIG. 10 is a schematic view of an X-ray tomographic image showing a vacancy point defect dominant domain, an interstitial silicon point defect dominant domain, and a perfect domain of a reference ingot according to the fourth embodiment of the present invention.

In the fourth embodiment the present invention, a silicon ingot is pulled up from a silicon melt based on the Voronkov theory, similarly to the first embodiment. The predetermined pulling-up speed profile of the fourth embodiment is the same one as that of the first embodiment. FIG. 10 that corresponds to FIG. 3 is provided for more detail description of the fourth embodiment. The reference numerals in FIG. 10 denote the same components as those in FIG. 3. The characteristic advantage of the fourth embodiment is that the wafer $W_2$ that corresponds to the Position $P_2$ includes a center domain dominated by vacancy point defects over half (50%) of the entire area of the wafer, compared with the wafer $W_1$.

Figure 11:
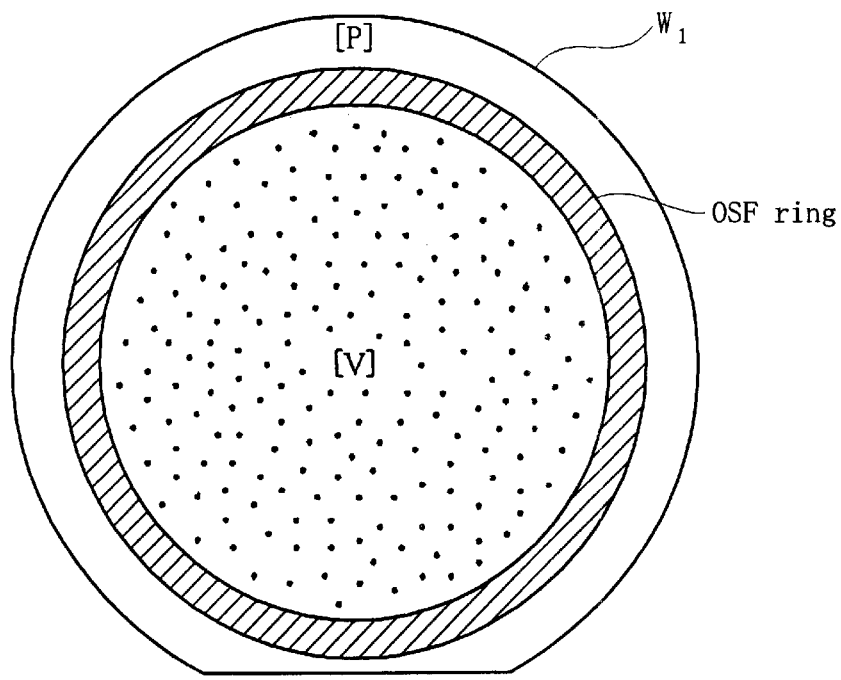
FIG. 11 is a plan view showing a situation where OSF's appear in a silicon wafer $W_1$ corresponding to a position $P_1$ in FIG. 10.

A small domain adjacent to the perfect domain dominated by vacancy point defects is the region with no generation of both COP and L/D in the wafer surface. The OSF's are generated when the silicon wafer is subjected to a heat treatment at a temperatures in a range of 1,000° C.±30° C. for 2 to 5 hours and subsequently heat treated at temperatures in a range of 1,130° C.±30° C. for 1 to 16 hours in an oxygen atmosphere in accordance with the conventional OSF manifesting heat treatment. In the wafer $W_1$, as shown in FIG. 11, OSF ring is generated around the peripheral edge of the wafer $W_1$. In general, furthermore, larger COP's tend to appear from the domain dominated with vacancy point defects surrounded by the OSP ring. On the other hand, the OSF's are not generated like a ring in the wafer $W_2$. It occurs only in a disk shape at the center of the wafer. The silicon wafer to be used in the fourth embodiment is the wafer $W_2$. In this wafer, OSF's occur in an area wider than 25% of the entire area of the wafer. In the case that OSF's area is less than 25% of the entire area of the wafer, BMD only generates in a narrower area, resulting in difficulty in exhibiting a sufficient IG effect. Therefore, a preferable area percentage of OSF's is 50 to 80%.

Figure 12:
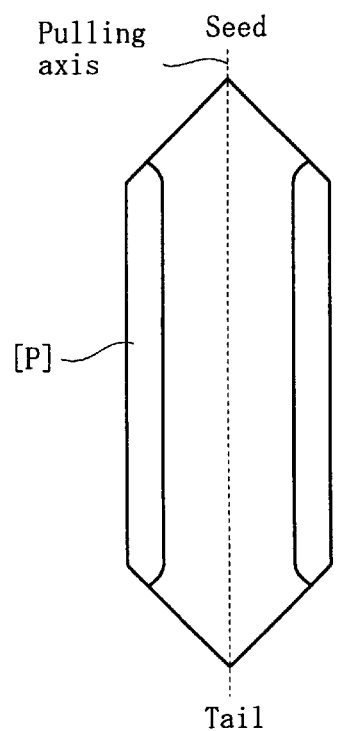
FIG. 12 is a cross sectional view showing an ingot sliced along in the axial direction through an axial center of the ingot, correspondingly to a position $P_2$ in FIG. 10.
Figure 13:
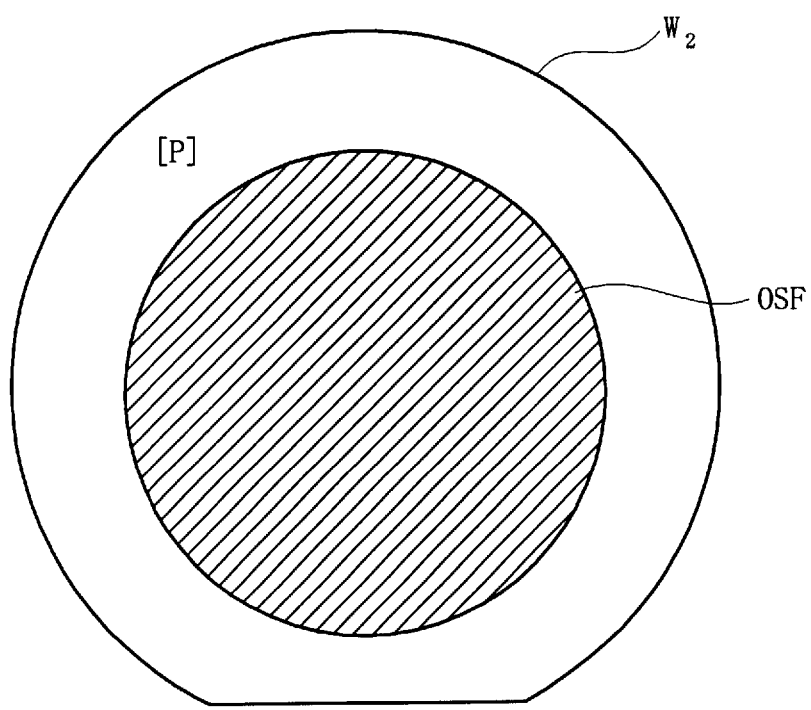
FIG. 13 is a plan view showing a situation where OSF's appear in the center of a silicon wafer $W_2$ corresponding to a position $P_2$ in FIG. 10.

The silicon wafer $W_2$ of the fourth embodiment is fabricated by slicing an ingot grown by a pulling-up speed profile selectively determined such that OSF's actualize not in a ring shape but over the center of the wafer as shown in FIG. 12. FIG. 13 is a plan view of the wafer $W_2$. This wafer $W_2$ is free of COP, since OSF's do not form a ring shape. Further, no interstitial-type large dislocation (L/D) occurs. The ingot for providing the wafer $W_2$ of the present invention includes BMD without dislocation generation, at a rate of $1 \times 10^5$ to $3 \times 10^7$ pieces/cm$^3$. Therefore, it becomes unnecessary to introduce oxygen precipitation nuclei at a high density into a wafer by holding the wafer state at relatively lower temperatures of 500 to 800° C. for 0.5 to 20 hours before rapidly heating such as described in the Japanese Patent Application Laid-Open No. HEI-8-45945. BMD densities less than $1 \times 10^5$ pieces/cm$^3$ results in difficulty in exhibiting a sufficient IG effect upon rapid heating in a wafer state. Further, the value of $3 \times 10^8$ pieces/cm$^3$ is the maximum density of BMD allowed to occur within the OSF domain.

The heat treatment method of the fourth embodiment may be the method in which the silicon wafer $W_2$ including BMD without dislocation generation at the aforementioned percentage at a room temperature is swiftly placed in a furnace heated to temperatures of 650° C. to 950° C. Another method is to arrange the silicon wafer including BMD without dislocation generation at the aforementioned percentage at a room temperature in a fast heating furnace using a lamp capable of generating higher temperatures, to turn on a lamp switch to start heating to thereby rapidly heat up to temperatures of 650 to 950° C. That is, the heat treatment of the fourth embodiment is also in the type of rapidly heating a wafer. The term "rapidly heat" herein means to conduct a heat treatment at a temperature elevating speed of 10° C./minute or over, preferably 30° C./minute or over. Rapidly heating the wafer by lamp light radiation enables uniform heating of the wafer, to thereby provide an advantage that the wafer warps lesser than a situation of introduction thereof into a pre-heated furnace. Final temperatures lower than 650° C. reached by rapid heating lead to insufficient disappearance of BMD near the wafer surface, thereby failing to ensure a sufficient DZ. Further, exceeding 950° C. leads to occurrence of dislocation before disappearance of BMD near the wafer surface, thereby failing to ensure a sufficient DZ. Therefore, the preferable temperatures may be in the range of 800° C. to 900° C.. Moreover, holding time less than 0.5 minute is too short to shrink BMD near the wafer surface, resulting in insufficient disappearance of BMD near the wafer surface and failing to ensure a sufficient DZ. Exceeding 30 minutes leads to a DZ having an excessive thickness and to affection on productivity. Therefore, the preferable holding times may be in the range of 0.5 minutes to 30 minutes, preferably 10 minutes to 30 minutes. The rapidly heating treatment may be performed in a nitrogen or oxygen atmosphere or in the air. Preferably, it is performed in a nitrogen atmosphere.

Leaving the silicon wafer at a room temperature after the rapid heating leads to formation of a DZ over a depth of 1 to 100 μm from the wafer surface, to thereby provide a wafer having a BMD density of $1 \times 10^5$ to $3 \times 10^7$ pieces/cm$^3$ in a portion deeper than this DZ. This wafer exhibits a higher IG effect.

EXAMPLES

There will be described hereinafter examples of the present invention together with comparative examples.

Example 1

An ingot is pulled up from a silicon melt to grow the domain corresponding to the position $P_2$ shown in FIG. 3 throughout the length of the ingot. To control the oxygen concentration within the ingot at this time, the flow rate of argon was kept at about 110 liter/minute, the rotational speed of a quartz crucible for storing the silicon melt was kept at about 5 to 10 rpm, and the pressure within the hot zone furnace was kept at about 60 Torr.

Silicon wafers sliced out from the thus pulled up ingot were lapped, chamfered, and then mirror-polished to thereby prepare silicon wafers. Each of the silicon wafers is subjected to the step of removing any damage on the surface thereof, followed by forming the polysilicon layer of 1.5 $\mu$m in thickness on the back of the wafer by the CVD method using $SiH_4$ at 680° C. Subsequently, the silicon wafer is polished to a mirror-smooth state, resulting in the finished silicon wafer having a diameter of 8 inches and a thickness of 725 $\mu$m.

Comparative Example 1

For comparison, there was prepared to comparative example 1 from the same silicon wafer as that of the example 1 except that the polysilicon layer is not formed on the silicon wafer of the comparative example 1.

Comparative Evaluation 1

The silicon wafer of the example 1 and the silicon wafer of the comparative example 1 are subjected to a first heat treatment in imitation of the heat treatment in the semiconductor device process. That is, each of these silicon wafers is heat treated in an atmosphere of oxygen at temperatures of 800° C. for 4 hours and subsequently heat treated at temperatures of 1,000° C. for 16 hours. oxygen concentrations of an area extending from the center to the outer edge of the surface of each of the silicon wafers of the example 1 and the comparative example 1 are measured by Fourier transform infrared spectroscopic analysis (FT–IR). The difference $\Delta[Oi]$ between oxygen concentrations before and after the heat treatment are shown in FIG. 14.

Another silicon wafer of the example 1 and another silicon wafer of the comparative example 1 are subjected to a second heat treatment in imitation of the heat treatment in the semiconductor device process. That is, each of these silicon wafers is heat treated in an atmosphere of oxygen at temperatures of 700° C. for 8 hours and subsequently heat treated at temperatures of 1,000° C. for 12 hours. Oxygen concentrations of an area extending from the center to the outer edge of the surface of each of the silicon wafers of the example 1 and the comparative example 1 are measured by Fourier transform infrared spectroscopic analysis (FT–IR). The difference $\Delta[Oi]$ between oxygen concentrations before and after the heat treatment are shown in FIG. 15.

Figure 14:
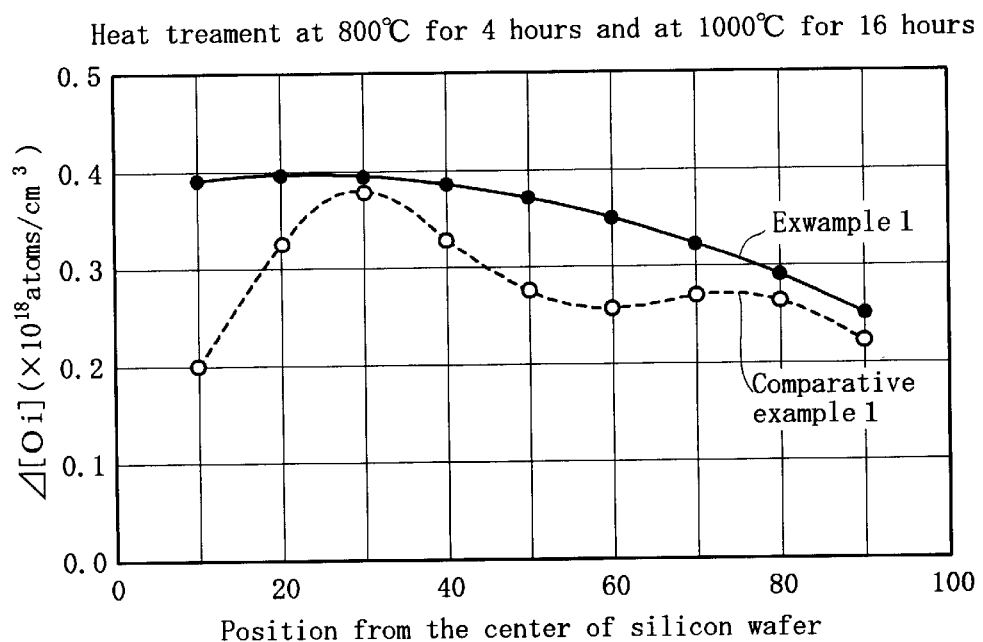
FIG. 14 is a view showing a situation of Δ[Oi] in the wafer surface at the time of before or after the first heat treatment depending on the heat treatment in the semiconductor device process for each of the silicon wafers of the first example and the first comparative example.
Figure 15:
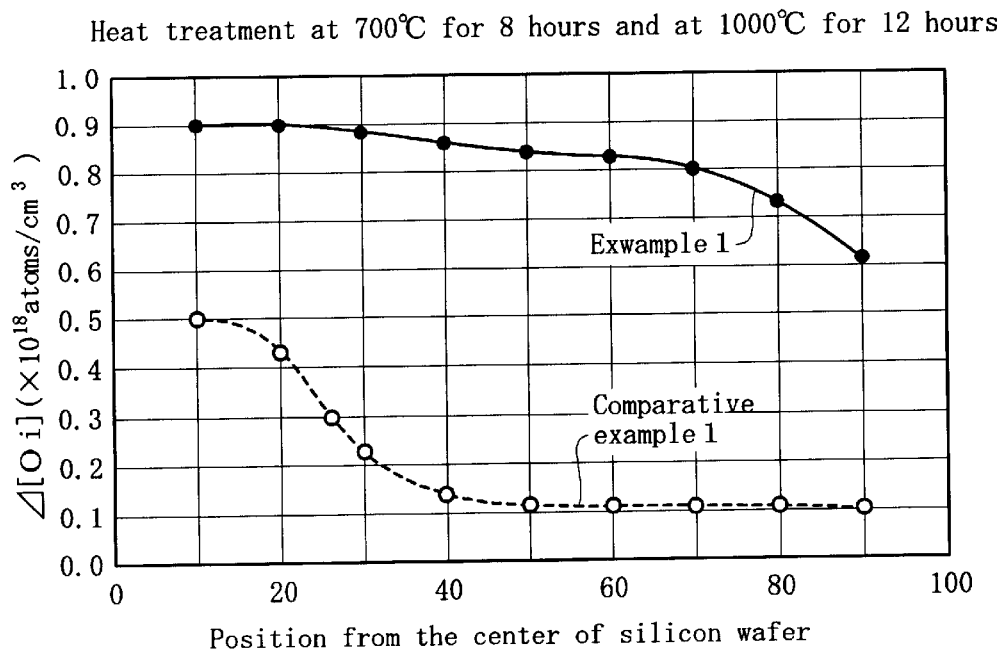
FIG. 15 is a view showing a situation of Δ[Oi] in the wafer surface at the time of before or after the second heat treatment depending on the heat treatment in the semiconductor device process for each of the silicon wafers of the first example and the first comparative example.

As shown in FIG. 14 and FIG. 15, there are large fluctuations in the difference $\Delta[Oi]$ between oxygen concentrations before and after the heat treatment on the area from the center to a point 40 mm away of the wafer of the comparative example 1. On the other hand, the mild slope of the difference $\Delta[Oi]$ between oxygen concentrations before and after the heat treatment is observed on the area from the center to a point 90 mm away of the wafer of the example 1, so that it is substantially uniform in the wafer surface as a whole.

Furthermore, still another silicon wafer of the example 1 and still another silicon wafer of the comparative example 1 are subjected to a heat treatment. That is, each of them is heat treated at a temperature of 1000° C. for 4 hours and subsequently at a temperatures of 1300° C. for 3 hours (pyrogenic oxidation treatment), followed by making a visual check on the presence of absence of OSF actualization. As a result, whitish OSF's are observed at the center of the silicon wafer prepared in the conventional example 1. On the other hand, there is no OSF found on the wafer surface of the example 1.

Example 2

Boron (B) doped p-type silicon ingots each having a diameter of 8 inches were pulled up by a single crystal of silicon pulling up apparatus. Each ingot had a straight body length of 1,200 mm, a crystal orientation of (100), a specific resistance of about 10 $\Omega$cm, and an oxygen concentration of $1.0 \times 10^{18}$ atoms/cm$^3$ (old ASTM). These ingots were two in number, and grown under the same condition while continuously decreasing the V/G upon pulling up from 0.24 mm$^2$/minute °C. to 0.18 mm$^2$/minute °C. One of the ingots was cut at its center in the pulling up direction as shown in FIG. 8 to check positions of respective domains, and the other ingot was sliced to provide, as a specimen, a silicon wafer $W_3$ corresponding to the position $P_3$ in FIG. 8. The wafer as the specimen in this example is the wafer $W_3$ shown in FIG. 9 and includes a center domain $[P_V]$, a domain $[P_I]$ that surrounds the domain $[P_V]$, and a domain $[P_V]$ that surrounds these domains.

The wafer $W_3$ sliced out from the ingot and then mirror-polished was heat treated by heating the wafer in a nitrogen atmosphere at a temperature of approximately 650° C. and holding the wafer for 30 seconds.

Example 3

The wafer $W_3$ sliced out from the ingot and then mirror-polished was heat treated by the same way as that of the example 2 except that the heat treatment was performed at a temperature of approximately 650° C. with the holding time of 90 seconds.

Example 4

The wafer $W_3$ sliced out from the ingot and then mirror-polished was heat treated by the same way as that of the example 2 except that the heat treatment was performed at a temperature of approximately 650° C. with the holding time of 210 seconds.

Example 5

The wafer $W_3$ sliced out from the ingot and then mirror-polished was heat treated by the same way as that of the example 2 except that the heat treatment was performed at a temperature of approximately 750° C. with the holding time of 60 seconds.

Example 6

The wafer $W_3$ sliced out from the ingot and then mirror-polished was heat treated by the same way as that of the example 2 except that the heat treatment was performed at a temperature of approximately 750° C. with the holding time of 90 seconds.

Example 7

The wafer $W_3$ sliced out from the ingot and then mirror-polished was heat treated by the same way as that of the example 2 except that the heat treatment was performed at a temperature of approximately 850° C. with the holding time of 30 seconds.

Example 8

The wafer $W_3$ sliced out from the ingot and then mirror-polished was heat treated by the same way as that of the example 2 except that the heat treatment was performed at a temperature of approximately 850° C. with the holding time of 120 seconds.

Comparative Example 2

The wafer $W_3$ sliced out from the same ingot as that of the example 2 except that the mirror-polished wafer $W_3$ was not subjected to the heat treatment.

Comparative Example 3

The wafer $W_3$ sliced out from the ingot and then mirror-polished was heat treated by the same way as that of the example 2 except that the heat treatment was performed at a temperature of approximately 650° C. with the holding time of 100 seconds.

Comparative Example 4

The wafer $W_3$ sliced out from the ingot and then mirror-polished was heat treated by the same way as that of the example 2 except that the heat treatment was performed at a temperature of approximately 750° C. with the holding time of 20 seconds.

Comparative Example 5

The wafer $W_3$ sliced out from the ingot and then mirror-polished was heat treated by the same way as that of the example 2 except that the heat treatment was performed at a temperature of approximately 800° C. with the holding time of 100 seconds.

Comparative Evaluation 2

Four pieces of silicon wafers $W_3$ of each of the examples 2 to 8 and the comparative examples 2 to 5 were prepared. Then, four different solutions that respectively contain Fe, Cr, Ni, and Cu were dropped on the surfaces of the respective wafers by means of a spin coating, obtaining four wafers being entirely contaminated with Fe, Cr, Ni, Cu, respectively. All of the contaminated wafers $W_3$ were subjected to sequential heat treatments at 900° C. for 2 hours, 1000° C. for 0.5 hours, and 800° C. for 1.5 hours in that order. In each wafer, the metal element was dispersed in the bulk of the wafer. The heat treatment after the step of contaminating the wafer were carried out as the same way as that of the device manufacturing process in the semiconductor manufacturing industry.

Figure 16A:
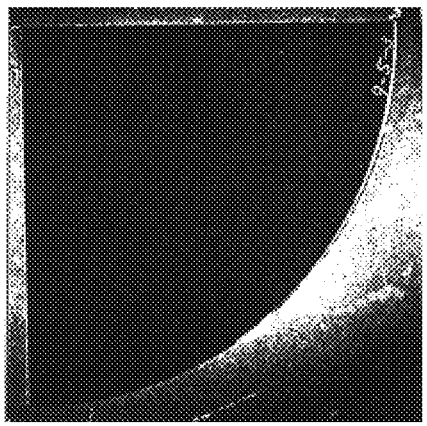
FIG. 16A is a microscopic photograph of the silicon wafer $W_3$ of the second embodiment prepared by the process including the step of contaminating the wafer $W_3$ with Fe for determining the presence or absence of haze after the diffusion of Fe into the bulk.
Figure 16B:
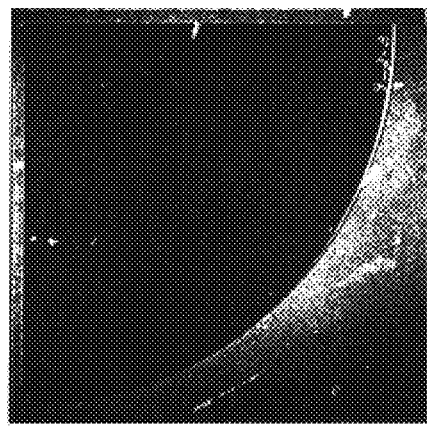
FIG. 16B is a microscopic photograph of the silicon wafer $W_3$ of the second embodiment prepared by the process including the step of contaminating the wafer $W_3$ with Cr for determining the presence or absence of haze after the diffusion of Cr into the bulk.
Figure 16C:
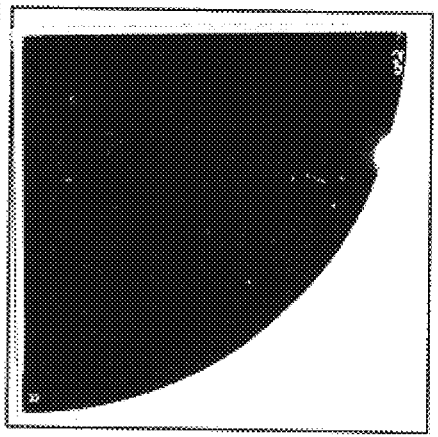
FIG. 16C is a microscopic photograph of the silicon wafer $W_3$ of the second embodiment prepared by the process including the step of contaminating the wafer $W_3$ with Ni for determining the presence or absence of haze after the diffusion of Ni into the bulk.
Figure 16D:
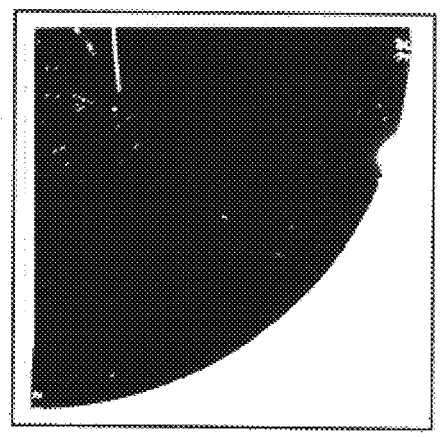
FIG. 16D is a microscopic photograph of the silicon wafer $W_3$ of the second embodiment prepared by the process including the step of contaminating the wafer $W_3$ with Cu for determining the presence or absence of haze after the diffusion of Cu into the bulk.
Figure 17A:
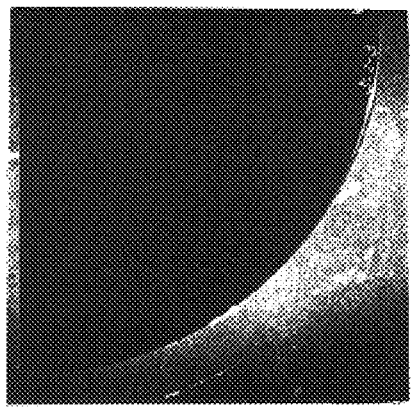
FIG. 17A is a microscopic photograph of the silicon wafer $W_3$ of the second comparative embodiment prepared by the process including the step of contaminating the wafer $W_3$ with Fe for determining the presence or absence of haze after the diffusion of Fe into the bulk.
Figure 17B:
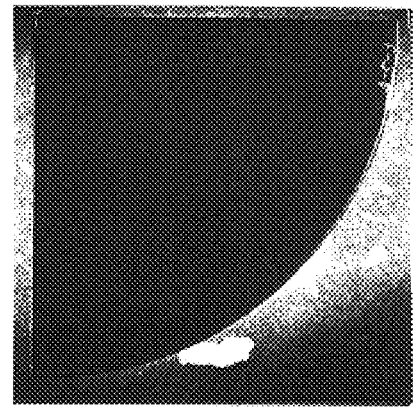
FIG. 17B is a microscopic photograph of the silicon wafer $W_3$ of the second comparative embodiment prepared by the process including the step of contaminating the wafer $W_3$ with Cr for determining the presence or absence of haze after the diffusion of Cr into the bulk.
Figure 17C:
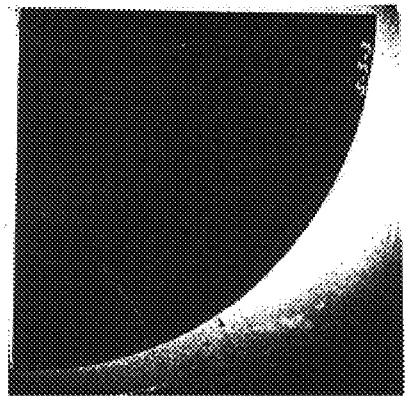
FIG. 17C is a microscopic photograph of the silicon wafer $W_3$ of the second comparative embodiment prepared by the process including the step of contaminating the wafer $W_3$ with Ni for determining the presence or absence of haze after the diffusion of Ni into the bulk.
Figure 17D:
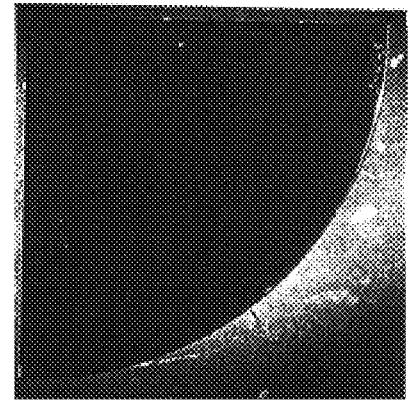
FIG. 17D is a microscopic photograph of the silicon wafer $W_3$ of the second comparative embodiment prepared by the process including the step of contaminating the wafer $W_3$ with Cu for determining the presence or absence of haze after the diffusion of Cu into the bulk.

For confirming the IG effects of the metal contaminants, those contaminated wafers were etched to about 2 μm in thickness by a secoetching solution. the presence or absence of haze under a light-gathering light was detected. The results of the presence or absence of haze with respect to the examples 2 to 8 and the comparative examples 2 to 5 are listed in Table 1. In addition, optical microscope photographs of the example 2 are shown in FIG. 16A to FIG. 16D, while optical microscope photographs of the compatible example 2 are shown in FIG. 17A to FIG. 17D. In FIG. 16A, a quarter of the Fe-contaminated wafer of the example 2 is shown. In FIG. 17A, the Fe-contaminated wafer of the comparative example 2 is shown. Likewise, FIGS. 16B and 17B, FIGS. 16C and 17C, and FIG. 16D and FIG. 17D show quarters of the Cr-, Ni-, and Cu-contaminated wafers of the example 2 and the comparative example 2, respectively.

TABLE 1

| | Heat Treatment Condition | | Presence or Absence of Haze | |
| --- | --- | --- | --- | --- |
| | Temperature (° C.) | Time (min.) | Domain $[P_V]$ | Domain $[P_I]$ |
| Exp. 2 | 650 | 30 | Absence | Absence |
| Exp. 3 | 650 | 90 | Absence | Absence |
| Exp. 4 | 650 | 210 | Absence | Absence |
| Exp. 5 | 750 | 60 | Absence | Absence |
| Exp. 6 | 750 | 90 | Absence | Absence |
| Exp. 7 | 850 | 30 | Absence | Absence |
| Exp. 8 | 850 | 120 | Absence | Absence |
| Comp. 2 | — | — | Absence | Presence |
| Comp. 3 | 650 | 100 | Absence | Presence |
| Comp. 4 | 750 | 20 | Absence | Presence |
| Comp. 5 | 800 | 100 | Absence | Presence |

* In Table 1, "Exp." is an abbreviation for "Example" and "Comp." is an abbreviation for "Comparative Example".

As is evident from Table 1, FIG. 16A to FIG. 16D, and FIG. 17A to FIG. 17D, haze is only observed in the domain $[P_I]$ of the wafer prepared in each of the comparative examples 2 to 5. It is conceivable that the densities of oxygen precipitation nuclei under the heat treatment conditions of the comparative examples 2 to 5 are low so that the IG effects cannot be exerted by the heat treatment after the contamination. On the other hand, the wafers of the examples 2 to 8 do not show any haze, so that each of them allows a high density of the oxygen precipitation nuclei on the whole surfaces of both the domains $[P_V]$ and $[P_I]$, resulting that they exert their IG effects.

Example 9

Boron (B) doped p-type silicon ingots each having a diameter of 8 inches were pulled up by a single crystal of silicon pulling up apparatus. Each ingot had a straight body length of 1,200 mm, a crystal orientation of (100), a specific resistance of about 10 Ωcm, and an oxygen concentration of $1.0 \times 10^{18}$ atoms/cm$^3$ (old ASTM). These ingots were two in number, and grown under the same condition while continuously decreasing the V/G upon pulling up from 0.24 mm$^2$/minute °C. to 0.18 mm$^2$/minute °C. One of the ingots was cut at its center in the pulling up direction as shown in FIG. 8 to check positions of respective domains, and the other ingot was sliced to provide, as a specimen, a silicon wafer $W_3$ corresponding to the position $P_3$ in FIG. 8. The wafer as the specimen in this example is the wafer $W_3$ shown in FIG. 9 and includes a center domain $[P_V]$, a domain $[P_I]$ that surrounds the domain $[P_V]$, and a domain $[P_V]$ that surrounds these domains.

The wafer $W_3$ sliced out from the ingot and then mirror-polished was heat treated by heating the wafer at room temperature to 1,150° C. at a temperature elevating speed of 50° C./second without holding the silicon wafer at a temperature of 1,150° C.

Example 10

The wafer $W_3$ sliced out from the ingot and then mirror-polished was heat treated at a temperature of 1,150° C. by the same way as that of the example 9 except that the wafer $W_3$ was held for 5 seconds.

Example 11

The wafer $W_3$ sliced out from the ingot and then mirror-polished was heat treated at a temperature of 1,150° C. by the same way as that of the example 9 except that the wafer $W_3$ was held for 30 seconds.

Example 12

The wafer $W_3$ sliced out from the ingot and then mirror-polished was heat treated by the same way as that of the example 9 except that the wafer $W_3$ was heated at a temperature of 1,200° C. without holding the wafer $W_3$ at 1,200° C.

Example 13

The wafer $W_3$ sliced out from the ingot and then mirror-polished was heat treated by the same way as that of the example 9 except that the wafer $W_3$ was heated at a temperature of 1,200° C. and held for 5 seconds.

Example 14

The wafer $W_3$ sliced out from the ingot and then mirror-polished was heat treated by the same way as that of the example 9 except that the wafer $W_3$ was heated at a temperature of 1,200° C. and held for 30 seconds.

Comparative Example 6

The wafer $W_3$ was sliced out from the ingot and then mirror-polished by the same way as that of the example 9 except that the wafer $W_3$ was not subjected to the heat treatment.

Comparative Example 7

The wafer $W_3$ sliced out from the ingot and then mirror-polished was heat treated by the same way as that of the example 9 except that the wafer $W_3$ was heated at a temperature of 1,100° C. and held for 5 seconds.

Comparative Example 8

The wafer $W_3$ sliced out from the ingot and then mirror-polished was heat treated by the same way as that of the example 9 except that the wafer $W_3$ was heated at a temperature of 1,100° C. and held for 30 seconds.

Comparative Example 9

The wafer $W_3$ sliced out from the ingot and then mirror-polished was heat treated by the same way as that of the example 9 except that the wafer $W_3$ was heated at a temperature of 1,100° C. and held for 60 seconds.

Comparative Example 10

The wafer $W_3$ sliced out from the ingot and then mirror-polished was heat treated at a temperature of 1,500° C. by the same way as that of the example 9 except that the wafer $W_3$ was held for 60 seconds.

Comparative Example 11

The wafer $W_3$ sliced out from the ingot and then mirror-polished was heat treated by the same way as that of the example 9 except that the wafer $W_3$ was heated at a temperature of 1,200° C. and held for 60 seconds.

Comparative Example 12

The wafer $W_3$ sliced out from the ingot and then mirror-polished was heat treated by the same way as that of the example 9 except that the wafer $W_3$ was heated at a temperature of 1,250° C. and held for 5 seconds.

Comparative Example 13

The wafer $W_3$ sliced out from the ingot and then mirror-polished was heat treated by the same way as that of the example 9 except that the wafer $W_3$ was heated at a temperature of 1,250° C. and held for 30 seconds.

Comparative Evaluation 3

Heat treatment was carried out in imitation of the heat treatment in the device manufacturing process in the semiconductor manufacturing industry. That is, silicon wafers of the examples 9 to 14 and the comparative examples 6 to 13 were subjected to a heat treatment in an oxygen atmosphere at 800° C. for 4 hours and subsequently in an oxygen atmosphere at 1,000° C. for 16 hours. After the heat treatment, each waver was truncated and then subjected to the process of selective etching on the wafer surface using a Wright etching solution. Optical microscopic observations were performed for the purpose of detecting the presence or absence of slip and measuring the BMD surface density of each of the portions corresponding to the domains [$P_V$] and [$P_I$] at a depth of 350 μm from the wafer surface. The results are listed in Table 2.

TABLE 2

| | Heat Treatment Condition | | BMD Area Density ($\times 10^4/cm^2$) | | Presence or Absence of Slip |
|---|---|---|---|---|---|
| | Temp. (° C.) | Time (Second) | [$P_V$] | [$P_I$] | |
| Exp. 9 | 1150 | 0 | 3.6 | 3.5 | Absence |
| Exp. 10 | 1150 | 5 | 2.4 | 2.3 | Absence |
| Exp. 11 | 1150 | 30 | 1.2 | 1.0 | Absence |
| Exp. 12 | 1200 | 0 | 532.0 | 411.0 | Absence |
| Exp. 13 | 1200 | 5 | 412.0 | 356.0 | Absence |
| Exp. 14 | 1200 | 30 | 37.7 | 77.3 | Absence |
| Comp. 6 | Untreated | | 40.0 | 0.1 | Absence |
| Comp. 7 | 1100 | 5 | 1.0 | 0.1 | Absence |
| Comp. 8 | 1100 | 30 | 2.2 | 0.1 | Absence |
| Comp. 9 | 1100 | 60 | 2.2 | 0.1 | Absence |
| Comp. 10 | 1150 | 60 | 0.5 | 0.1 | Presence |
| Comp. 11 | 1200 | 60 | 125.0 | 0.5 | Presence |
| Comp. 12 | 1250 | 5 | 73.5 | 68.5 | Presence |
| Comp. 13 | 1250 | 30 | 65.4 | 58.8 | Presence |

* In Table 2, "Exp." is an abbreviation for "Example" and "Comp." is an abbreviation for "Comparative Example".

As is evident from Table2, the portion corresponding to the domain [$P_I$] of the wafer of each of the comparative examples 6 to 11 could not attain the BMD surface density ($1\times10^4/cm^2$, preferably $2\times10^4/cm^2$) responsible for exerting the IG effect. Regarding the wafers of the comparative examples 12 and 13, portions corresponding to the domains [$P_V$] and [$P_I$] caused slips in spite of permitting the BMD area densities of more than $2\times10^4/cm^2$. Regarding the wafers of the examples 9, 10, 12 to 14, on the other hand, the portions corresponding to the domains [$P_V$] and [$P_I$] permitted the higher BMD area densities. In the case of the wafer of the example 11, by the way, the distribution of precipitation in the wafer surface was uniform in spite of the BMD surface density of less than $2\times10^4/cm^2$.

Example 15

A silicon ingot was pulled up from a silicon melt such that the ratio (V/G) of a pulling-up speed to a temperature gradient was held at a value equal to or greater than a second critical ratio (($V/G)_2$) and equal to or less than a third critical ratio (($V/G)_3$), as shown in FIG. 1, for generating OSF in an area that corresponds to 25% of the entire area of the wafer when the wafer was subjected to a heat treatment in an oxygen atmosphere at 1,000° C. for 2 hours and subsequently at 1,100° C. for 12 hours. The total length of the ingot corresponded to the position $P_2$ shown in FIG. 10. Each of the silicon wafer was sliced out from the thus pulled up ingot. Then, the wafer was lapped, chamfered and then mirror-polished, to thereby prepare a mirror-finished silicon wafer.

The mirror-finished wafer was heated up to 850° C. from room temperature at an elevating speed of 30° C., and held for 5 minutes. Subsequently, the temperature was lowered to a room temperature.

Example 16

The silicon wafer was subjected to the heat treatment at a temperature of 850° C. for 5 minutes elevated at the same speed as that of the example 15, except that the ingot was pulled up so as to generate the OSF's in an area that corresponds to 50% of the entire area of the wafer.

Example 17

The silicon wafer was subjected to the heat treatment at a temperature of 850° C. for 0.5 minutes elevated at the same speed as that of the example 15, except that the ingot was pulled up so as to generate the OSF's in an area that corresponds to 80% of the entire area of the wafer.

Example 18

The silicon wafer was subjected to the heat treatment at a temperature of 850° C. for 5 minutes elevated at the same speed as that of-the example 15, except that the ingot was pulled up so as to generate the OSF's in an area that corresponds to 80% of the entire area of the wafer.

Example 19

The silicon wafer was subjected to the heat treatment at a temperature of 850° C. for 10 minutes elevated at the same speed as that of the example 15, except that the ingot was pulled up so as to generate the OSF's in an area that corresponds to 80% of the entire area of the wafer.

Example 20

The silicon wafer was subjected to the heat treatment at a temperature of 850° C. for 20 minutes elevated at the same speed as that of the example 15, except that the ingot was pulled up so as to generate the OSF's in an area that corresponds to 80% of the entire area of the wafer.

Example 21

The silicon wafer was subjected to the heat treatment at a temperature of 850° C. for 30 minutes elevated at the same speed as that of the example 15, except that the ingot was pulled up so as to generate the OSF's in an area that corresponds to 80% of the entire area of the wafer.

Example 22

The silicon wafer was subjected to the heat treatment at a temperature of 700° C. for 5 minutes elevated at the same speed as that of the example 15, except that the ingot was pulled up so as to generate the OSF's in an area that corresponds to 80% of the entire area of the wafer.

Example 23

The silicon wafer was subjected to the heat treatment at a temperature of 800° C. for 5 minutes elevated at the same speed as that of the example 15, except that the ingot was pulled up so as to generate the OSF's in an area that corresponds to 80% of the entire area of the wafer.

Example 24

The silicon wafer was subjected to the heat treatment at a temperature of 950° C. for 5 minutes elevated at the same speed as that of the example 15, except that the ingot was pulled up so as to generate the OSF's in an area that corresponds to 80% of the entire area of the wafer.

Comparative Example 14

The silicon wafer was subjected to the heat treatment at a temperature of 850° C. for 5 minutes elevated at the same speed as that of the example 15, except that the ingot was pulled up so as to generate the OSF's in an area that corresponds to 15% of the entire area of the wafer.

Comparative Example 15

The silicon wafer was subjected to the heat treatment at a temperature of 640° C. for 5 minutes elevated at the same speed as that of the example 15, except that the ingot was pulled up so as to generate the OSF's in an area that corresponds to 80% of the entire area of the wafer.

Comparative Example 16

The silicon wafer was subjected to the heat treatment at a temperature of 1000° C. for 5 minutes elevated at the same speed as that of the example 15, except that the ingot was pulled up so as to generate the OSF's in an area that corresponds to 80% of the entire area of the wafer.

Comparative Example 17

The silicon wafer was subjected to the heat treatment at a temperature of 85° C. for 40 minutes elevated at the same speed as that of the example 15, except that the ingot was pulled up so as to generate the OSF's in an area that corresponds to 80% of the entire area of the wafer.

Comparative Evaluation 4

Optical microscopic observations were performed for the purpose of measuring the width of DZ and detecting the presence or absence of slip and measuring the BMD density at a depth of 250 μm from the wafer surface. The results are listed in Table 3. In addition, FIG. 8 shows a microscopic photograph of BMD in the wafer after the rapid heating of the example 18, magnified 50,000 times.

TABLE 3

| | Total Area Ratio (%) of Domain OSF | IG Heat Treatment Condition | | BMD density (×10$^6$/cm$^3$) | DZ Width (μm) |
| --- | --- | --- | --- | --- | --- |
| | | Temp. (° C.) | Time (min.) | | |
| Exp. 15 | 25 | 850 | 5 | 2.6 | 40 |
| Exp. 16 | 50 | 850 | 5 | 3.4 | 40 |
| Exp. 17 | 80 | 850 | 0.5 | 10.0 | 15 |
| Exp. 18 | 80 | 850 | 5 | 10.0 | 35 |
| Exp. 19 | 80 | 850 | 10 | 11.0 | 45 |
| Exp. 20 | 80 | 850 | 20 | 10.0 | 65 |
| Exp. 21 | 80 | 850 | 30 | 12.0 | 85 |
| Exp. 22 | 80 | 700 | 5 | 23.0 | 20 |
| Exp. 23 | 80 | 800 | 5 | 22.0 | 35 |

TABLE 3-continued

| | Total Area Ratio (%) of Domain OSF | IG Heat Treatment Condition | | BMD density (×10⁶/cm³) | DZ Width (μm) |
|---|---|---|---|---|---|
| | | Temp. (° C.) | Time (min.) | | |
| Exp. 24 | 80 | 950 | 5 | 24.0 | 55 |
| Comp. 14 | 15 | 850 | 5 | less than 1.0 | 100 or over |
| Comp. 15 | 80 | 640 | 5 | 20.0 | 0 |
| Comp. 16 | 80 | 1000 | 5 | 5.0 | 100 or over |
| Comp. 17 | 80 | 850 | 40 | 12 | 100 or over |

* In Table 1, "Exp." is an abbreviation for "Example" and "Comp." is an abbreviation for "Comparative Example".

As is evident from Table 3, regarding the comparative example 15, the OSF domain occupies too small area, i.e., only 15% of the total area of the silicon surface after the IG heat treatment, so that the BMD density cannot reach the order of $10^6/cm^3$ to be required for exerting the IG effect. Regarding the comparative example 15, the heat treatment temperature is too small, i.e., only 640° C., so that the DZ cannot be formed on the wafer surface. Regarding the comparative example 16, the heat treatment temperature is too high, i.e., 1000° C., so that the width of DZ is too wide more than necessary. Regarding the comparative example 17, furthermore, the heat treatment temperature is too long, i.e., 40 minutes, so that the width of DZ is too wide more than necessary. On the other hand, the silicon wafers of the examples 15 to 24 have their respective BMD densities on the order of $10^6$ to $10^7/cm^3$. Among them, each of the examples 17 to 22 has the OSF domain that occupies 80% of the total area of the wafer surface, so that the BMD density is on the order of $10^7/cm^3$. Particularly, the examples 19 to 21 in which the heat treatment time is 10 to 30 minutes and the example 24 in which the heat treatment temperature is 950° C. attains the wide DZ of 45 to 85 μm in thickness.

Figure 18:
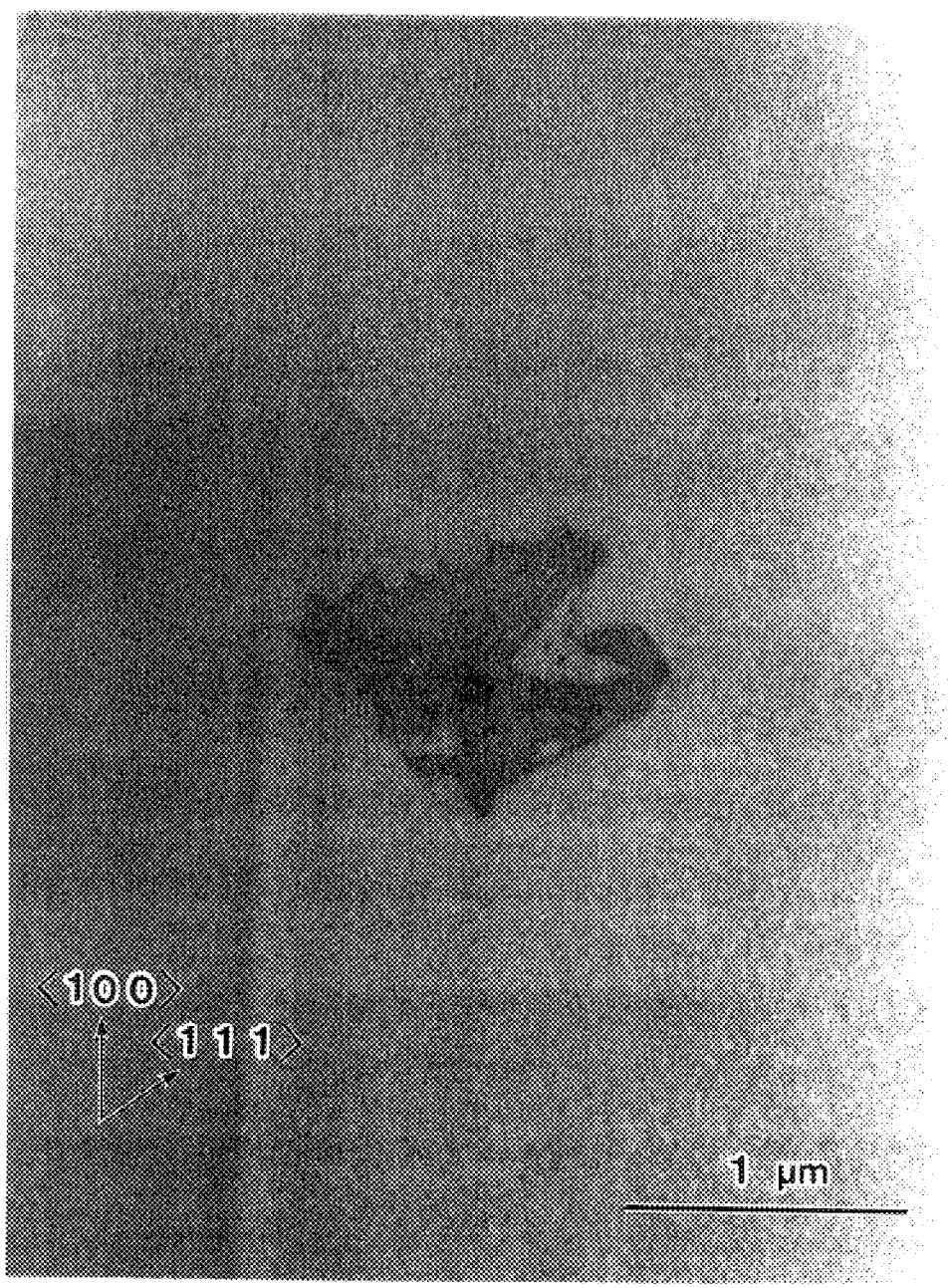
FIG. 18 is a microscopic photograph showing a situation of oxygen precipitation (BMD) in the silicon wafer after the rapid heating process of the example 18.

The microscopic photograph shown in FIG. 18 reveals that the dislocation of BMD is also occurred in the wafer after performing the rapid heat treatment.

What is claimed is:

1. A method of manufacturing a silicon wafer having a polysilicon layer, comprising the steps of:

preparing a silicon wafer having an oxygen concentration of $1.2 \times 10^{18}$ atoms/cm³ or less (old ASTM) without generating crystal originated particles and interstitial large dislocation;

forming a polysilicon layer of 0.1 μm to 1.6 μm in thickness on a back of the silicon wafer by a chemical-vapor deposition;

wherein the silicon wafer before the formation of the polysilicon layer thereon is the type of a wafer in which oxidation induced stacking faults manifest itself at a center of the wafer when the silicon wafer is heat-treated in an oxygen atmosphere at 1000° C.±30° C. for 2 to 5 hours and subsequently at 1130° C.±30° C. for 1 to 16 hours.

2. A method of heat-treating a silicon wafer, comprising the steps of:

preparing a silicon wafer having an oxygen concentration of $1.2 \times 10^{18}$ atoms/cm³ or less (old ASTM) without generating crystal originated particles and interstitial large dislocation;

forming a polysilicon layer of 0.1 μm to 1.6 μm in thickness on a back of the silicon wafer by a chemical-vapor deposition at a temperature of 670° C.±30° C.; and heat-treating the silicon wafer having the polysilicon layer in an oxygen atmosphere at 1000° C.±30° C. for 2 to 5 hours and subsequently at 1130° C.±30° C. for 1 to 16 hours, wherein the silicon wafer before the formation of the polysilicon layer thereon is the type of a wafer in which oxidation induced stacking faults manifest itself at a center of the wafer when the wafer is subjected to the heat-treatment.

3. A method of heat-treating a silicon wafer sliced out from an ingot consisting of a perfect domain [P], comprising the steps of:

pulling up a silicon monocrystal ingot consisting of a mixed domain of [$P_V$] and [$P_I$] and having an oxygen concentration of $0.8 \times 10^{18}$ to $1.4 \times 10^{18}$ atoms/cm³ (old ASTM) from a silicon melt;

slicing the ingot into silicon wafers; and holding the sliced silicon wafer in a gaseous atmosphere selected from the group consisting of nitrogen, argon, hydrogen, oxygen, and mixtures thereof at a temperature of 600 to 850° C. for 30 to 90 minutes, where [$P_I$] is a domain neighboring with a domain [I], is classified into the perfect domain [P], and has a concentration of interstitial silicons lower than the lowest concentration of interstitial silicons capable of forming interstitial dislocations, and where [$P_V$] is a domain neighboring with a domain [V], is classified into the perfect domain [P], and has a concentration of vacancies equal to or lower than a concentration of vacancies capable of forming crystal originated particles or flow pattern defects, where the domain [I] is a domain dominated by interstitial silicon point defects and including agglomerates of interstitial silicon point defects within an ingot, the domain [V] is a domain dominated by vacancy point defects and including agglomerates of vacancy point defects within the ingot, and the perfect domain [P] is a domain including no agglomerates of vacancy point defects and no agglomerates of interstitial silicon point defects.

4. A method as claimed in claim 3, wherein the heat-treatment is a heat-treatment for forming a polysilicon layer on a back of the silicon wafer by a chemical vapor deposition.

5. A method of heat-treating a silicon wafer sliced out from an ingot consisting of a perfect domain [P], comprising the steps of:

pulling up a silicon monocrystal ingot consisting of a mixed domain of [$P_V$] and [$P_I$] and having an oxygen concentration of $0.8 \times 10^{18}$ to $1.4 \times 10^{18}$ atoms/cm³ (old ASTM) from a silicon melt;

slicing the ingot into silicon wafers; and holding the sliced silicon wafer in a gaseous atmosphere selected from the group consisting of nitrogen, argon, hydrogen, oxygen, and mixtures thereof at a temperature of 600 to 850° C. for 120 to 250 minutes, where [$P_I$] is a domain neighboring with a domain [I], is classified into the perfect domain [P], and has a concentration of interstitial silicons lower than the lowest concentration of interstitial silicons capable of forming interstitial dislocations, and where [$P_V$] is a domain neighboring with a domain [V], is classified into the perfect domain [P], and has a concentration of vacancies equal to or lower than a concentration of vacancies capable of forming crystal originated particles or flow pattern defects, where the domain [I] is a domain dominated by interstitial silicon point defects and including agglomerates of interstitial silicon point defects within an ingot, the domain [V] is a domain dominated by vacancy point defects and including agglomerates of vacancy point defects within the ingot, and the perfect domain [P] is a domain including no agglomerates of vacancy point defects and no agglomerates of interstitial silicon point defects.

6. A method as claimed in claim 5, wherein the heat-treatment is a heat-treatment for forming a polysilicon layer on a back of the silicon wafer by chemical vapor deposition.

7. A method of heat-treating a silicon wafer sliced out from an ingot consisting of a perfect domain [P], comprising the steps of:

pulling up a silicon monocrystal ingot consisting of a mixed domain of [$P_V$] and [$P_I$] and having an oxygen concentration of $0.8 \times 10^{18}$ to $1.4 \times 10^{18}$ atoms/cm$^3$ (old ASTM) from a silicon melt;

slicing the ingot into silicon wafers;

heating the sliced silicon wafer in a gaseous atmosphere selected from the group consisting of nitrogen, argon, hydrogen, oxygen, and mixtures thereof at rising temperatures from room temperature to a predetermined temperature of 1150° C. to 1200° C. at a rate of 10 to 150° C./second; and holding the heated silicon wafer at the predetermined temperature of 1150° C. to 1200° C. for 0 to 30 seconds, where [$P_I$] is a domain neighboring with a domain [I], is classified into the perfect domain [P], and has a concentration of interstitial silicons lower than the lowest concentration of interstitial silicons capable of forming interstitial dislocations, and where [$P_V$] is a domain neighboring with a domain [V], is classified into the perfect domain [P], and has a concentration of vacancies equal to or lower than a concentration of vacancies capable of forming crystal originated particles or flow pattern defects, where the domain [I] is a domain dominated by interstitial silicon point defects and including agglomerates of interstitial silicon point defects within an ingot, the domain [V] is a domain dominated by vacancy point defects and including agglomerates of vacancy point defects within the ingot, and the perfect domain [P] is a domain including no agglomerates of vacancy point defects and no agglomerates of interstitial silicon point defects.

8. A method of heat-treating a silicon wafer, comprising the steps of:

pulling up a silicon monocrystal ingot from a silicon melt;

forming a silicon wafer from the ingot; and rapidly heating the silicon wafer from a room temperature to a predetermined temperature of 650 to 950° C. at a rate of 10° C./minute or over and holding the silicon wafer for 0.5 to 30 minutes, wherein the silicon wafer generates oxidation induced stacking faults in an area wider than 25% of the entire area thereof and an oxygen precipitation of $1 \times 10^5$ to $3 \times 10^7$/cm$^3$ without an occurrence of dislocation when the wafer is subjected to the heat-treatment.

9. A method as claimed in claim 8, wherein the silicon monocrystal ingot is pulled out from the silicon melt so that the silicon wafer to be obtained therefrom generates oxidation induced stacking faults in an area wider than 25% of the entire area of the silicon wafer and an oxygen precipitation of $1 \times 10^5$ to $3 \times 10^7$/cm$^3$ without an occurrence of dislocation when the silicon wafer is subjected to the heat-treatment.

10. A silicon monocrystal ingot prepared by the method as claimed in claim 9.

11. A silicon wafer heat-treated by the method as claimed in claim 8, wherein a layer that produces no oxygen precipitation is formed at a depth of 1 to 100 μm from a surface of the silicon wafer; and a layer that produces an oxygen precipitation of $1 \times 10^5$ to $3 \times 10^7$/cm$^3$ is formed at a place deeper than the layer that produces no oxygen precipitation.

* * * * *